(12) United States Patent
Itou

(10) Patent No.: US 7,416,932 B2
(45) Date of Patent: Aug. 26, 2008

(54) POWER COMPOSITE INTEGRATED SEMICONDUCTOR DEVICE AND MANUFACTURING METHOD THEREOF

(75) Inventor: Hiroyasu Itou, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/785,619

(22) Filed: Apr. 19, 2007

(65) Prior Publication Data

US 2007/0187841 A1    Aug. 16, 2007

Related U.S. Application Data

(62) Division of application No. 11/132,282, filed on May 19, 2005, now Pat. No. 7,235,844.

(30) Foreign Application Priority Data

May 20, 2004    (JP)    ............... 2004-150745
Nov. 11, 2004    (JP)    ............... 2004-328123

(51) Int. Cl.
    *H01L 29/72*    (2006.01)
(52) U.S. Cl. ............... 438/197; 438/149; 438/151; 438/653; 438/656; 438/666; 438/685; 438/687; 438/688
(58) Field of Classification Search ............... 438/197, 438/149, 151, 653, 656, 666, 685, 687, 688
    See application file for complete search history.

(56) References Cited

U.S. PATENT DOCUMENTS 6,229,221 B1    5/2001    Kloen et al.
6,472,304 B2    10/2002    Chittipeddi et al.
6,620,720 B1    9/2003    Moyer et al.
6,727,593 B2    4/2004    Toyoda et al.
2006/0081931 A1*    4/2006    Yamazaki et al. ............ 257/347

FOREIGN PATENT DOCUMENTS

| EP | 058 7442 | 9/1993 |
| JP | A-2001-015516 | 1/2001 |
| JP | A-2002-353221 | 12/2002 |
| JP | A-2003-068738 | 3/2003 |

OTHER PUBLICATIONS

T. Efland et al., "Lead Frame on Chip Offers Integrated Power Bus and Bond Over Active Circuit," *Proceedings of 2001 International Symposium on Power Semiconductor Device & ICs*, Osaka, pp. 65-68, 2001.

* cited by examiner

*Primary Examiner*—Edward Wojciechowicz
(74) *Attorney, Agent, or Firm*—Posz Law Group, PLC

(57) ABSTRACT

A high-reliability power composite integrated semiconductor device uses thick copper electrodes as current collecting electrodes of a power device portion to resist wire resistance needed for reducing ON-resistance. Furthermore, wire bonding connection of the copper electrodes is secured, and also the time-lapse degradation under high temperature which causes diffusion of copper and corrosion of copper is suppressed. Still furthermore, direct bonding connection can be established to current collecting electrodes in the power device portion, and also established to a bonding pad formed on the control circuit portion in the control circuit portion. A pad area at the device peripheral portion which has been hitherto needed is reduced, so that the area of the device is saved, and the manufacturing cost is reduced.

8 Claims, 31 Drawing Sheets

| MATERIAL | YOUNG'S MODULUS (kg/mm2) | MODULUS OF RIGIDITY (kg/mm2) |
|---|---|---|
| Al | 7.19E+03 | 2.72E+03 |
| Au | 8.02E+03 | 2.82E+03 |
| Ti | 1.08E+04 | 4.06E+03 |
| Cu | 1.25E+04 | 4.64E+03 |

FIG. 31

| MAKER | | A COMPANY | B COMPANY | C COMPANY | D COMPANY |
|---|---|---|---|---|---|
| MATERIAL | | POLYIMIDE | | | |
| TYPE | | NON-PHOTO-SENSITIVITY | PHOTO-SENSITIVITY POSITIVE TYPE | PHOTO-SENSITIVITY NEGATIVE TYPE | PHOTO-SENSITIVITY NEGATIVE TYPE  |
| PHYSICAL PROPERTIES AFTER CURING | FILM THICKNESS AFTER CURING (um) | 3-10 | 1-10 | 2-40 | 2-10 |
| | TENSILE STRENGTH (MPa) | 120 | 141 | 190 | 200 |
| | DEGREE OF ELASTICITY (GPa) | 3 | 3.3 | 3.4 | 3.2 |
| | ELONGATION AFTER FRACTURE (%) | 10 | 20 | 45 | 70 |
| | COEFFICIENT OF LINEAR EXPANSION (ppm) | 50 | 36 | 30 | 40 |
| | Tg (°C) | 290 | 272 | 290 | 285 |
| | WATER ABSORPTION PERCENTAGE (%) | 1.2 | 0.9 | 2.0 | 3 |
| | BREAKDOWN VOLTAGE (kV/mm) | 330 | 420 | — | 300 |

POWER DEVICE PORTION | CONTROL CIRCUIT PORTION

POWER DEVICE PORTION | CONTROL CIRCUIT PORTION

POWER COMPOSITE INTEGRATED SEMICONDUCTOR DEVICE AND MANUFACTURING METHOD THEREOF

CROSS REFERENCE TO RELATED APPLICATIONS

This application is a division of application Ser. No. 11/132,282 filed on May 19, 2005 now U.S. Pat. No. 7,235,844, which is based upon, claims the benefit of priority of, and incorporates by reference the contents of Japanese Patent Application Nos. 2004-150745 filed on May 20, 2004 and 2004-328123 filed on Nov. 11, 2004.

FIELD OF THE INVENTION

The present invention relates to an integrated semiconductor device in which a power device and a control circuit are arranged in a composite style (hereinafter referred to as power composite integrated semiconductor device) and a method of manufacturing method thereof, and particularly to a power composite integrated semiconductor device that has a power device portion having a low ON-resistance, can be miniaturized and has high temperature reliability.

BACKGROUND OF THE INVENTION (First Prior Art)
FIG. 12 schematically shows a cross-sectional structure of a general conventional power composite integrated semiconductor device J1. In the power composite integrated semiconductor device J1 of FIG. 12, reference numeral 22 represents a power device portion, and reference numeral 23 represents a control circuit portion.

In the power composite integrated semiconductor device J1 of FIG. 12, in order to reduce the ON-resistance of a power device to be combined, it is needed to reduce not only the normalized ON-resistance determined by the structure of the power device, but also the wire resistance of wires 27. Aluminum alloy is generally used as a wire material. However, it is considered that copper having smaller specific resistance is used to reduce the wire resistance.

FIG. 13 is a schematic top view showing an embodiment of a mount style using wire bonding in the conventional general power composite integrated semiconductor device J1.

The power composite integrated semiconductor device J1 shown in FIG. 13 is constituted by a power device portion 200 surrounded by two-dotted chain line and a control circuit portion 204 surrounded by a broken line in FIG. 13 and also a dedicated pad area (reference numerals 24, 25 of FIG. 12) having no function element there under at the peripheral portion. A bonding wire 206 is connected to bonding pads 203 and 205 on the pad area, whereby the power composite integrated semiconductor device J1 is mounted. With respect to this mount style, when the power device portion 200 and the control circuit portion 204 are reduced in area by miniaturization, but the number of bonding pads 203, 205 for input/output is equal to that before the miniaturization, the chip size of the power composite integrated semiconductor device J1 is determined by the number of the bonding pads 203, 205 and the pitch thereof, and thus there occurs a problem that the manufacturing cost of the power composite integrated semiconductor device J1 cannot be reduced.

(Second Prior Art)
FIGS. 14A, 14B show another conventional power composite integration semiconductor device J2. The power composite integrated semiconductor device J2 of FIGS. 14A, B is a flip chip type power composite integrated semiconductor device, wherein FIG. 14A is a schematic diagram showing a cross-sectional structure of the power composite integrated semiconductor device J2, and FIG. 14B shows a state where solder 42 is mounted on an electrode portion.

In the power composite integrated semiconductor device J2 shown in FIGS. 14A, B, copper having lower resistance than aluminum alloy is used as an electrode material of a collector electrode to reduce the ON-resistance of the power device portion 32. In the flip chip type power composite integrated semiconductor device J2, as shown in FIG. 14A, a nickel-plated layer 40 and a gold-plated layer 41 are formed on a copper-plated electrode 39 formed in each of the pad areas 34, 35. Thereafter, as shown in FIG. 14B, the solder 42 is mounted on the electrode portion, and the device is mounted through the solder 42 on a print board or the like.

FIGS. 15A to 15D are cross-sectional views showing the sequential steps of a manufacturing method of the power composite integrated semiconductor device J2 of FIG. 14A.

First, as shown in FIG. 15A, an aluminum wire 72 is formed and protected by silicon nitride film, and then predetermined opening portions are formed.

Subsequently, as shown in FIG. 15B, a barrier layer 74 and a copper seed layer 75 are formed on the surface of a silicon substrate 71, and then resist 75 with electrode forming portions opened is formed.

Subsequently, as shown in FIG. 15C, a copper layer 77, a nickel layer 78 and a gold layer 79 are successively formed with the resist 75 as a mask by plating.

Finally, as shown in FIG. 15D, the resist 75 is removed, and then the whole surface thereof is subjected to etching to remove unnecessary portions of the copper seed layer 75 and barrier layer 74.

The power composite integrated semiconductor device J2 shown in FIG. 14A is thus manufactured.

In the power composite integrated semiconductor device J2 shown in FIGS. 14A, 14B, the electrode formation precision is high. However, it uses the solder 42 for connection in the mounting step and also has a structure that the electrodes are exposed. Therefore, it has a problem that it is impossible to narrow the pad interval in order to keep the insulation performance between the electrodes.

(Third Prior Art)
Recently, there has been-carried out an attempt of reducing the wire resistance of a power device by using the technique of forming copper electrodes in the power composite integrated semiconductor device J2 described above (ISPSD 2001 pp 65-68, non-patent document 1).

FIG. 16 is a schematic diagram showing the cross-sectional structure of another power composite integrated semiconductor device J3 to which the technique of forming the copper electrode in the power composite integrated semiconductor device J2 is applied. Reference numeral 50 in the power composite integrated semiconductor device J3 of FIG. 16 represents polyimide resin film.

In the power composite integrated semiconductor device J3 shown in FIG. 16, a thick-film copper-plated electrode 39 having low resistance is formed on the power electrode portion 32 to reduce the wire resistance of the power device portion 32. Furthermore, a pad area for drawing out the output of the power device is reduced. Therefore, there is achieved a power composite integrated semiconductor device J3 which is low in ON-resistance and reduced in area.

When the power composite integrated semiconductor device J3 is mounted by using generally-used gold wires 42 which can be connected at a narrow interval, it is extremely difficult to directly bond and connect the gold wires 42 to the copper electrodes 39 which are extremely liable to be oxidized because copper oxide film is formed at the bonding time. Therefore, the structure that the nickel-plated layer 40 and the gold-plated layer 41 are laminated on the copper electrodes 39 as shown in FIG. 16 has been hitherto used.

FIG. 17 shows an investigation result of the relationship between the film thickness of the gold-plated layer 41 and the shear force of the bonding connection. As shown in FIG. 17, the shear force indicating the bonding strength is dependent on the gold plating thickness of the uppermost layer, and a gold plating thickness of about 0.5 μm is needed to achieve sufficient strength.

FIG. 18 shows an investigation result of the relationship between the time for which the device of the above electrode structure is left under high-temperature and high-humidity and the tensile strength of bonding connection when the film thickness of the gold-plated layer 41 is varied. As shown in FIG. 18, there is a tendency that the reliability of the bonding connection is lowered as the gold plating thickness is larger.

As the results of FIGS. 17 and 18, in the power composite integrated semiconductor device J3 shown in FIG. 16, it is difficult to establish both the strength and the reliability by the bonding mounting method using the gold wires 42 for the electrodes having the structure that the nickel-plated layer 40 and the gold-plated layer 41 are laminated on the copper electrode 39.

(Fourth Prior Art)

It is estimated that a structure in which gold bonding can be easily performed and the wire resistance of the power device can be reduced can be achieved by increasing the thickness of the aluminum wires 27 of the uppermost layer in the structure shown in FIG. 12. However, when the aluminum wires 27 of the uppermost layer is merely increased, the coating performance of the nitride film for protecting the device to the aluminum wires 27 of the uppermost layer of is deteriorated, resulting in occurrence of a reliability problem of the device. Therefore, the following structure shown in FIG. 19 is analogized.

FIG. 19 is a diagram showing a schematic cross-sectional structure of another conventional power composite integrated semiconductor device J4.

In the power composite integrated semiconductor device J4 shown in FIG. 19, the control circuit portion 45 is completely covered by the nitride film 48. By forming the thick-film aluminum electrode 49 on the power device portion 44, the wire resistance of the power device portion 44, and also the pad area for drawing out the output of the power device can be reduced, and thus the power composite integrated semiconductor device J4 which is low in ON-resistance and saved in area.

FIGS. 20A to 20D are cross-sectional views of each step of a method of manufacturing the power composite integrated semiconductor device J4 of FIG. 19.

First, as shown in FIG. 20A, an aluminum wire 88 is formed and then protected by silicon nitride film 89, and then predetermined opening portions are formed.

Subsequently, as shown in FIG. 20B, an aluminum layer 90 of about 5 μm in thickness serving as electrodes are formed on the surface of the silicon substrate 87. Subsequently, resist 91 having predetermined openings is formed.

Subsequently, as shown in FIG. 20C, the aluminum layer 90 is subjected to patterning through wet etching by using the resist 91 as a mask.

Finally, as shown in FIG. 20D, the resist 91 is removed, and then a polyimide resin layer 94 having predetermined openings is formed.

The power composite integrated semiconductor device J4 shown in FIG. 19 is manufactured as described above.

In the manufacturing method of the power composite integrated semiconductor device J4, the aluminum layer 90 is large in thickness, and thus it can be processed by only isotropic wet etching, so that under-cut 92 shown in FIG. 20C occurs in the etching step. There is a problem that the interval of pad electrodes of the control circuit portion 97 must be particularly increased due to the restriction of the under-cut 92.

Furthermore, FIG. 21 shows Young's modulus and modulus of rigidity of various kinds of electrode materials, and aluminum is lower in young's modulus and modulus of rigidity than the other materials. Therefore, as compared with the copper electrode 39 shown in FIG. 16, the aluminum electrode 93 is more easily deformed when gold wires 95 are directly bonded and connected to the thick-film aluminum electrodes formed on the power device portion 96. Due to the shock based on the deformation of the aluminum electrodes 93 in the bonding step, the crack or the like is liable to occur in the device area below the aluminum electrode 93, particularly the insulating layer formed of silicon nitride film 89.

Furthermore, FIG. 22 shows an investigation result of the thickness of the reaction layer between aluminum and gold when the device is left under high temperature. In a high temperature area from 150° C. to 200° C., the reaction progresses more as the film thickness of aluminum is larger as shown in FIG. 22. Accordingly, when the gold wires 95 are bonded and connected to the aluminum electrodes 93, the high-temperature reliability between the thick-film aluminum electrode 93 and the gold wire 95 is deteriorated by the reaction described above.

(Fifth Prior Art)

A copper wiring structure based on Damascene process used for a fine integrated circuit device is also known as a prior art which makes practical copper wires having excellent gold bonding and low resistance. This structure is disclosed in JP-A-2000-216191 (Patent Document 1), JP-A-2001-15516 (Patent Document 2), JP-A-2001-351940 (Patent Document 3), JP-A-2002-353221 (Patent Document 4), JP-A-2003-152015 (Patent Document 5), and copper wires are embedded in a flattened insulating layer.

FIG. 23 is a diagram schematically showing the cross-sectional structure of an integrated semiconductor device J5 based on the conventional Damascene process.

A bonding pad portion of the integrated semiconductor device J5 shown in FIG. 23 has a structure that aluminum alloy film 58 is laminated through a barrier layer 57 of titanium, titanium nitride film or the like on the surface of the copper wire 55 of about 1 μm in thickness.

FIGS. 24A to 24E are cross-sectional views showing the sequential process steps of a method of manufacturing the integrated semiconductor device J5 of FIG. 23.

Firstly, as shown in FIG. 24A, insulating film 101 is formed on a silicon substrate 100, and the insulating film 101 is flattened by CMP (Chemical Mechanical Polishing).

Subsequently, recesses 102 for forming a wiring pattern are formed as shown in FIG. 24B.

Subsequently, as shown in FIG. 24C, after the barrier layer 103 of tantalum nitride or the like is formed and a copper seed layer is formed, the whole surface of copper 104 is plated.

Subsequently, as shown in FIG. 24D, the copper-plated layer 104 is polished until the surface of the insulating film 101 by CMP to form copper wires 105.

Subsequently, as shown in FIG. 24E, fine multilayered copper wires of about 1 μm in thickness are formed by repeating the forming step of the insulating film 101, the flattening polishing step of the insulating film 101, the forming step of the recesses 102, the film forming step of the barrier layer 103 and the copper seed layer and the whole-surface plating of the copper 104 and the polishing step of the copper-plated layer 104.

Finally, after the aluminum alloy film 114 is laminated through the barrier layer 113 of titanium, titanium nitride or the like and patterning is conducted, silicon nitride film 115 having predetermined openings is formed, thereby bonding gold wires 116.

The integrated semiconductor device J5 shown in FIG. 23 is manufactured as described above.

In order to form a thick-film copper electrode layer by using the method of manufacturing the integrated semiconductor device J5 described above, the wire forming step must be repeated at plural times. Therefore, there is a problem that the device manufacturing cost is increased. In addition, when the copper electrode is broad, the center portion of the copper-plated layer is excessively polished in the polishing step, and thus a phenomenon of thinning of that portion (dishing) occurs. Accordingly, it is cumbersome and difficult to form wide and thick-film copper electrodes.

(Sixth Prior Art)

For example, as disclosed in JP-A-6-204277 (Patent Document 6) and JP-T-2002-532882 (Patent Document 7), it has been recently attempted to carry out a wiring step again after formation of silicon nitride film which means the completion of a wafer process of a semiconductor device and form bonding pads on the circuit (hereinafter referred to as re-wiring pads) in a recent WL-CSP (Wafer Level-Chip Size Package) technique, thereby reducing the outer peripheral area of the semiconductor device in which pads are formed, saving the area of the semiconductor device chip and reducing the cost. In the case of WL-CSP, the mounting step is carried out by using solder, and thus copper electrodes are used as re-wiring pads.

FIG. 25 is a diagram schematically showing the cross-sectional structure of an integrated semiconductor device J6 in which re-wiring pads are formed by using copper.

FIGS. 26A to 26E are cross-sectional views showing the sequential process steps of a method of manufacturing the integrated semiconductor device J6 of FIG. 25.

First, as shown in FIG. 26A, a first polyimide resin layer 122 is formed on a silicon substrate 119 on which an aluminum wire 120 and silicon nitride film 121 are formed. Subsequently, predetermined openings are formed in a polyimide resin layer 122 so as to be connected to the aluminum wire 120, and then a copper seed layer 124 is formed through a barrier layer 123.

Subsequently, as shown in FIG. 26B, a copper-plated layer 125 is formed by using a resist 126 having a predetermined opening as a mask.

Subsequently, as shown in FIG. 26C, after the resist 126 is removed, the whole surface is subjected to etching to remove unnecessary portions of the copper seed layer 124 and barrier layer 123, thereby forming a thick-film copper-plated electrode 127.

Subsequently, as shown in FIG. 26D, imide resin film 128 is coated to cover the copper electrode 127, and an opening pattern is formed by a photolithographic step. Thereafter, a thermally curing treatment is carried out at a temperature from 300 to 380° C.

Accordingly, a crosslinking reaction of the imide resin film 128 progresses, and a second polyimide layer 129 serving as final protection film having excellent heat resistance is formed as shown in FIG. 26E.

Finally, a nickel-plated layer 130 and a gold-plated layer 131 are formed at the opening portion.

The integrated semiconductor device J6 shown in FIG. 25 is manufactured as described above.

The bonding connection performance of the bonding pad portion of the integrated semiconductor device J6 shown in FIG. 25 has the same problem as described with reference to the power composite integrated semiconductor device J3 of FIG. 16 which has the thick-film copper electrode.

Furthermore, in the case of the power composite integrated semiconductor device J3 of FIG. 16, the power composite integrated semiconductor device J4 of FIG. 19 and the integrated semiconductor device J6 of FIG. 25 which have the thick-film electrode structure, thick polyimide film 50 or 69 is used as the final protection film. The thick polyimide film 50, 69 has high coating performance to the thick-film electrode, and it is used as a protector to water and contaminants invading from the external environment and a shock absorber in a plastic packaging step after wire bonding. When the electrodes are copper electrodes in these thick-film electrode structures (FIG. 16 and FIG. 25), nickel-plated layers 40, 67 and gold-plated layers 41, 68 are partially formed to keep the bonding connection performance. On the surfaces and side surfaces of the electrodes other than the above areas, the copper electrodes 39, 66 come into direct contact with the polyimide film 50, 69 serving as the final protection film.

FIG. 27 shows an investigation result of the reactivity (element diffusion) when the device of the structure in which copper and polyimide come into direct contact with each other is held at high temperature of 150 to 200° C. As shown in FIG. 27, a phenomenon that copper diffuses into polyimide occurs due to the high-temperature holding. Accordingly, when the electrode pitch is small, there occurs a time-lapse degradation problem that current leak occurs. This leak phenomenon is accelerated by water or oxygen passing through the polyimide film because the polyimide film cannot perfectly block off external water and oxygen.

FIG. 28 shows an investigation result of the adhesion strength between copper and polyimide after the thermally curing treatment by a long-term leaving test at 200° C. As shown in FIG. 28, there is a problem that the adhesion strength between copper and polyimide after the thermally curing treatment would be deteriorated when they are left for a long time at high temperature. Accordingly, in the case of the copper electrode having a large film thickness of 2 to 6 µm, in addition to the upper surface of the electrode, the area of the electrode side surface coming into contact with the polyimide film is increased, so that the time-lapse degradation problem of the high-temperature reliability such as inter-electrode leakage or exfoliation of polyimide is more remarkable.

[Non-patent Document 1] ISPSD 2001 pp 65-68
[Patent Document 1] JP-A-2000-216191
[Patent Document 2] JP-A-2001-15516
[Patent Document 3] JP-A-2001-351940
[Patent Document 4] JP-A-2002-353221
[Patent Document 5] JP-A-2003-152015
[Patent Document 6] JP-A-6-204277
[Patent Document 7] JP-T-2002-532882

SUMMARY OF THE INVENTION

As described above, the copper electrode has small specific resistance and thus it may be made as an electrode having low resistance. Furthermore, since it has high mechanical strength, it is hardly deformed in the bonding step and can dispersively moderate shock at the bonding time. The copper electrode needs to secure the bonding connection performance, and has a problem that diffusion of copper at high temperature and copper oxidation by a minute amount of water degrades the reliability.

The present invention has an object to provide a power composite integrated semiconductor device having high reliability in which copper electrodes are formed by a simple method, bonding connection performance is secured, and time-lapse degradation, particularly time-lapse degradation under high-temperature is suppressed, and a method of manufacturing the power composite integrated semiconductor device.

According to the present invention, a power composite integrated semiconductor device has a substrate having a structure that a control circuit portion and a power device portion are coated and protected by minute silicon nitride film, the silicon nitride film is opened at only a portion where input/output of the control circuit is carried out, and the silicon nitride film at the whole area of a current collecting area of each of the input and output at an input/output wiring portion of the power device portion is opened.

A thick-film copper electrode is disposed through titanium or titanium compound as a barrier layer at the opening portion of the input/output portion of the power device portion, and the upper surface and side surface of the copper electrode are coated with aluminum alloy through titanium or titanium compound as a barrier layer.

In the control circuit portion, a thin-film copper wire or aluminum alloy wire is formed from the opening portion of the input/output portion through titanium or titanium compound as a barrier layer. Furthermore, the copper electrode connected to the thin-film copper wire or aluminum alloy wire is disposed on an active region of the control circuit portion through titanium or titanium compound having excellent adhesiveness to the silicon nitride film. Furthermore, the copper electrode on the active region and at least the upper surface of the copper wire are coated with aluminum alloy through titanium or titanium compound as a barrier layer.

The surface of the power composite integrated semiconductor device is coated and protected by thick-film polyimide resin which is opened at only a portion needed for bonding connection.

The above structure can implement the reduction in ON resistance at thick-film copper electrode portion of the power device portion, and the pad electrode is disposed on the active region of the control circuit portion (and power device portion), so that the power composite integrated semiconductor device can be miniaturized. Furthermore, high bonding connection performance can be secured at the pad electrode, and the contact between polyimide and copper on the pad electrode and the wire is avoided, so that time-lapse degradation caused by copper can be suppressed and high reliability can be secured.

BRIEF DESCRIPTION OF THE DRAWINGS

The above and other objects, features and advantages of the present invention will become more apparent from the following detailed description made with reference to the accompanying drawings. In the drawings:

FIG. 31 is a diagram showing the properties of generally used several kinds of polyimide resin;

DETAILED DESCRIPTION OF THE PREFERRED EMBODIMENTS

Best modes for carrying out the present invention will be described with reference to the drawings.

First Embodiment

Figure 1:
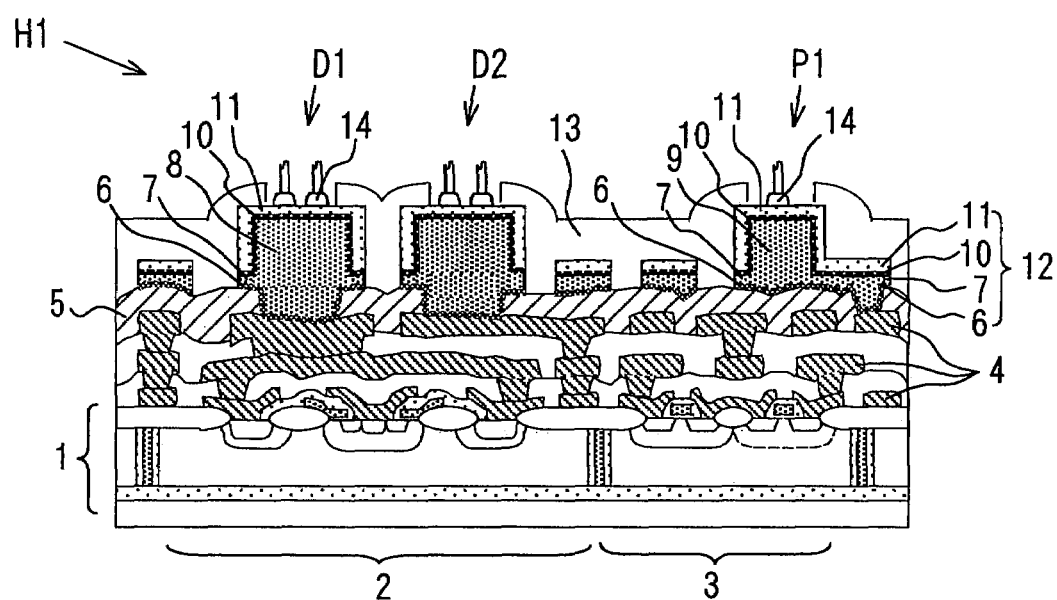
FIG. 1 is a cross-sectional view showing a power composite integrated semiconductor device according to a first embodiment.

FIG. 1 is a diagram schematically showing a power composite integrated semiconductor device H1 according to a first embodiment of the present invention.

The power composite integrated semiconductor device H1 shown in FIG. 1 is a power composite integrated semiconductor device in which a power device portion 2 having a power device formed therein and a control circuit portion 3 having a control circuit formed therein are disposed in a composite style on a surface layer portion of one silicon substrate 1. The power device portion 2 and the control circuit portion 3 are connected by first wires 4 formed of aluminum or aluminum alloy disposed on the silicon substrate 1 so as to carry out desired control.

Furthermore, silicon nitride film 5 is formed as insulating film for covering and protecting the first wires 4, on the silicon substrate 1. The silicon nitride film 5 is greatly opened at the power element portion 2 so that the input/output thereof can collect current on the first wires 5, and at least a portion for taking an input/output of the control circuit is opened in the control circuit portion 3.

In the power device portion 2, current collecting electrodes D1, D2 which are formed of thick-film copper electrodes 8 and connected through a first barrier layer 6 to first wires 4 below the first barrier layer 6. The first barrier layer 6 is formed of titanium, titanium nitride, titanium tungsten or the laminate film thereof. The thick-film copper electrode 8 is formed at a thickness of 2 to 8 μm through a copper seed layer 7 by electroplating, and it is designed so that the upper surface and the whole side surface thereof are coated with aluminum film (or aluminum alloy film) 11 of 0.8 to 1.5 μm in thickness through a second barrier layer 10 of 50 to 300 nm in thickness (aluminum cap layer). The second barrier layer 10 is also formed of titanium, titanium nitride, titanium tungsten or the laminate film thereof.

In the control circuit portion 3, a bonding pad P1 having the same structure as the current collecting electrodes D1, D2 of the power device portion 2 is disposed on the silicon nitride film 5 located in an active region. That is, the bonding pad P1 comprises a copper electrode 9 formed of at a thickness of 2 to 8 μm through the first barrier layer 6 by plating, and it is designed so that the upper surface and the whole side surface thereof is coated with aluminum film (or aluminum alloy film) 11 through the second barrier layer 10 (aluminum cap layer).

Furthermore, in order to take out the input/output of the control circuit, a second wire 12 achieved by the four layers of the first barrier layer 6, the thin copper wire layer (copper seed layer) 7, the second barrier layer 10 and the aluminum film (or aluminum alloy film) 11 is constructed so as to connect the first wires 4 and the bonding pad P1. A second wire 12 for connecting circuits is formed on the silicon nitride film 5 as occasion demands.

Furthermore, protection film 13 for covering and protecting the uppermost surface is formed on the silicon substrate 1. The protection film 13 is formed of thick polyimide resin film, and it is opened at only a portion needed for the bonding connection of a gold wire 14 in the formation portion at which the current collecting electrodes D1, D2 and the bonding pad P1.

FIGS. 2A to 2D and FIGS. 3A, 3B are cross-sectional views showing the sequential process steps of a method of manufacturing the integrated semiconductor device H1 of FIG. 1.

Figure 2A:
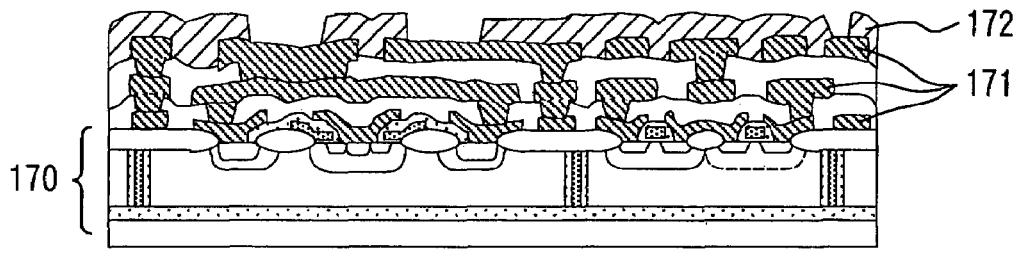
FIGS. 2A-2D are diagrams showing a method of manufacturing the power composite integrated semiconductor device according to the first embodiment.

First, as shown in FIG. 2A, a silicon substrate 170 in which a power device and a control circuit are combined with each other is wire-connected by aluminum (alloy) wires 171 so as to perform desired control. Subsequently, silicon nitride film 172 of 1.0 to 1.8 μm in thickness is formed as insulating film for covering and protecting the aluminum wires 171 on the silicon substrate 170. The silicon nitride film 172 is greatly opened in the power-device formed portion so that the input/output can collect current on the aluminum wires 171, and at least a portion for taking out the input/output of the control circuit is opened in the control-circuit formed portion.

Figure 2B:
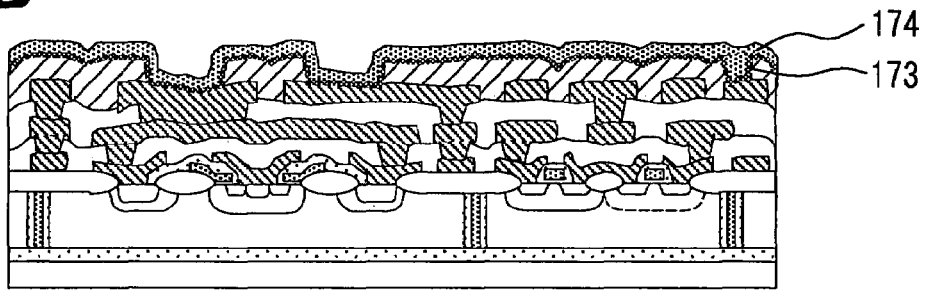

Subsequently, as shown in FIG. 2B, a first barrier layer 173 which has a thickness of 50 to 300 nm and is formed of titanium, titanium nitride, titanium tungsten or the laminate film thereof is formed on the silicon nitride film 172 so as to cover the opening portion of the silicon nitride film 172. Subsequently, a copper seed layer 174 of 0.1 to 1.0 μm is continuously formed under vacuum.

Figure 2C:
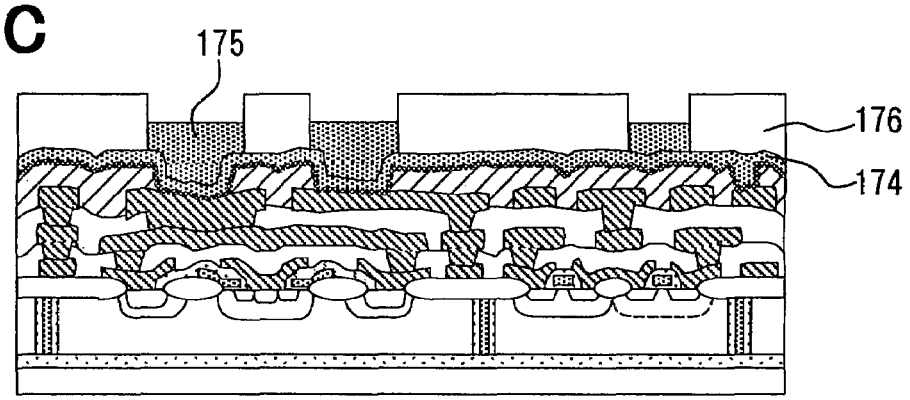

Subsequently, as shown in FIG. 2C, a resist 176 of about 10 μm in thickness is formed so as to open a portion at which a thick-film electrode will be formed by the photolithography technique. A copper-plated layer 175 of 2 to 7 μm in thickness is formed at the opening portion of the resist 176 with the resist 176 as a mask and the copper seed layer 174 as an electrode by using the electroplating technique which is low in manufacturing cost. The copper-plated layer 175 finally becomes a thick-film copper (plated) electrode 177.

Figure 2D:
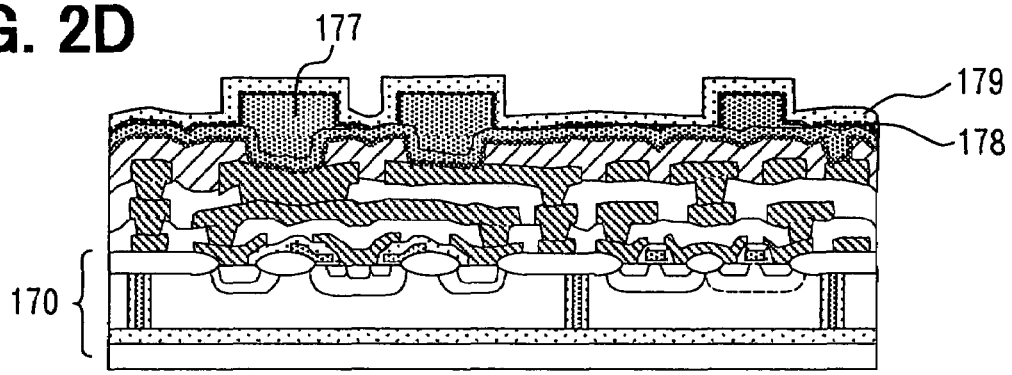

Subsequently, as shown in FIG. 2D, the resist 176 serving as the mask in the plating step is removed, and then a second barrier layer 178 of 50 to 300 nm in thickness is formed of titanium, titanium nitride, titanium tungsten or the laminate film thereof on the whole surface of the silicon substrate 170 so as to cover the whole of the thick-film copper-plated electrode 177. Furthermore, an aluminum cap layer 179 of aluminum or aluminum alloy is continuously formed at a thickness of 0.8 to 1.5 μm under vacuum on the whole surface of the silicon substrate 170 so as to cover the whole of the copper-plated electrode 177 as in the case of the second barrier layer 178.

Figure 3A:
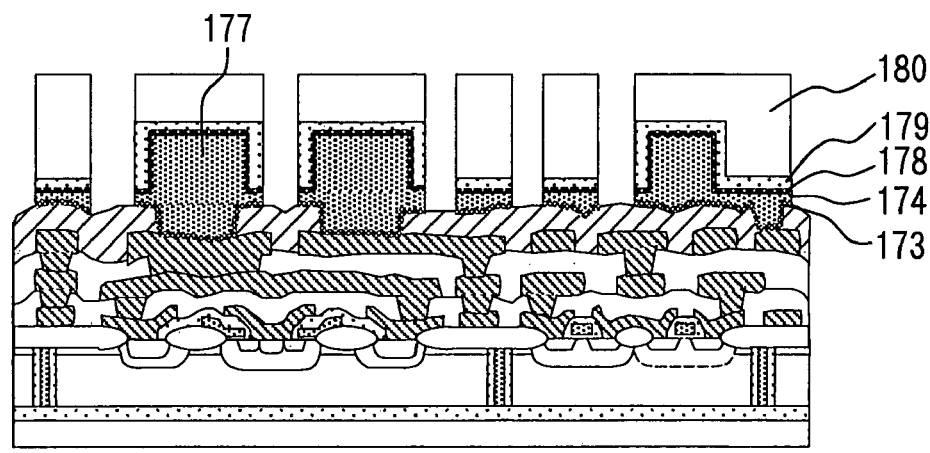
FIGS. 3A-3B are diagrams showing the method of manufacturing the power composite integrated semiconductor device according to the first embodiment.

Subsequently, a resist 180 is formed as shown in FIG. 3A. The resist 180 is patterned so as to perfectly cover the thick-film copper-plated electrode 177 and also so that the laminate portion of the four layers of the first barrier layer 173, the copper seed layer 174, the second barrier layer 178 and the aluminum cap layer 179 is usable as wires. The first barrier layer 173, the copper seed layer 174, the second barrier layer 178 and the aluminum cap layer 179 at unnecessary portions are removed with the resist 180 as a mask by etching.

Accordingly, there is formed the second wire comprising the laminate film of the four layers of the thick-film copper-plated electrode 177 coated with the aluminum cap layer 179 through the second barrier layer 178 on the upper surface and whole side surface thereof, the first barrier layer 173, the copper-seed layer 174, the second barrier layer 178 and the aluminum cap layer 179.

Figure 3B:
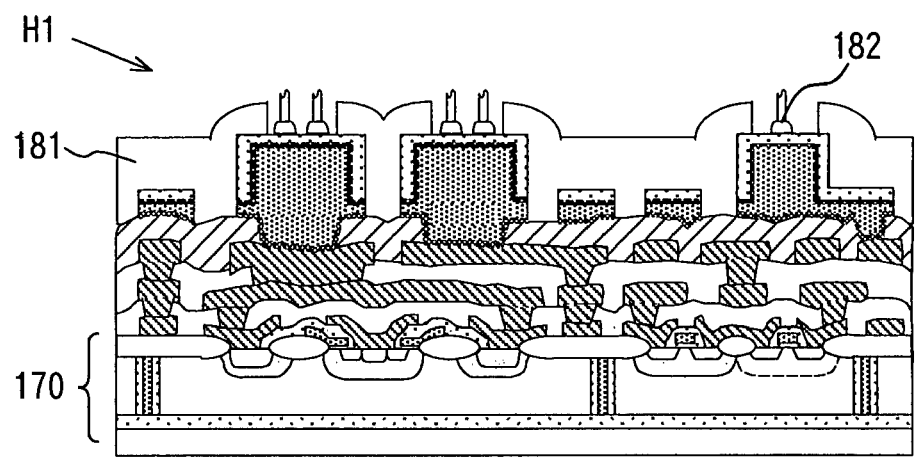

Finally, as shown in FIG. 3B, the resist 180 used as the mask is removed, and then the uppermost surface of the silicon substrate 170 is coated and protected by the polyimide resin film 181. The polyimide resin film 181 is opened at only a portion needed for the bonding connection and the gold wire 182 is bonded to the opening portion.

The power composite integrated semiconductor device H1 shown in FIG. 1 is manufactured as described above.

The power composite integrated semiconductor device H1 of FIG. 1 which is manufactured according to the above manufacturing method is designed so that the thick-film copper-plated electrode 8 formed by electroplating which is low in manufacturing cost is used as the current collecting electrodes D1, D2 of the input/output of the power device portion 2. Therefore, the wire resistance of the power device can be reduced.

Figure 28:
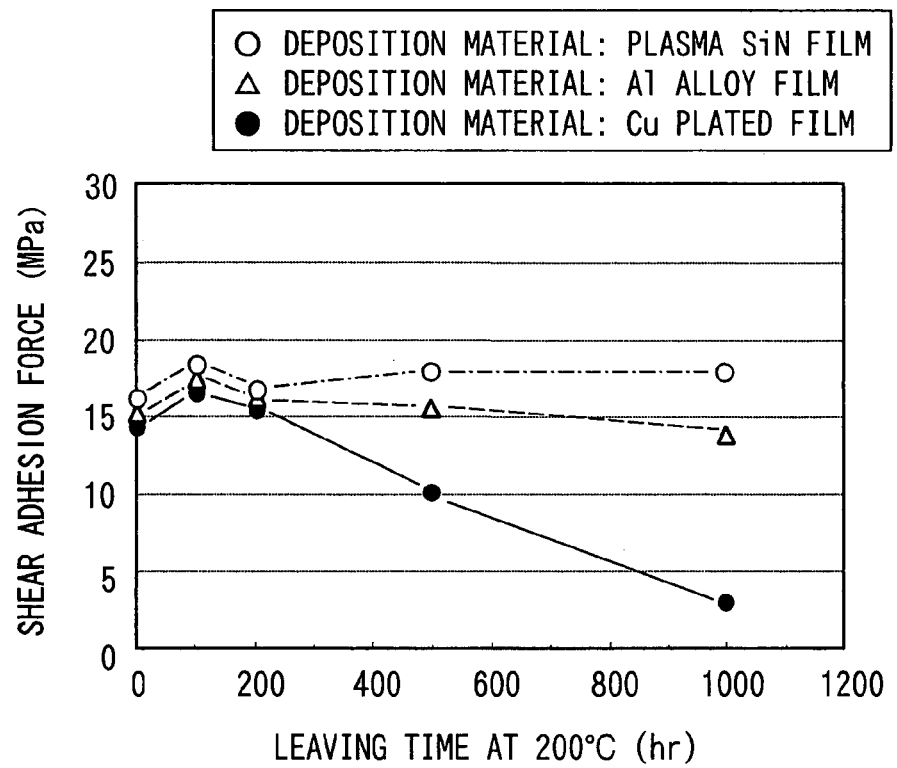
FIG. 28 is a diagram showing the time-lapse variation of adhesion strength of polyimide film.

The upper surface and whole side surface of the copper-plated electrode 8 is coated with the thin aluminum cap layer 11 of 0.8 to 1.5 μm through the second barrier layer 10. Therefore, the time-lapse variation under high temperature which appears in the thick aluminum film shown in FIG. 2 hardly occurs, and excellent bonding connection performance can be secured. Furthermore, the shock concerning the bonding connection can be absorbed by the aluminum cap layer 11 having lower mechanical strength than copper, and also a load applied in the bonding connection step can be dispersed by the thick-film copper-plated electrode 8, so that the device can have high resistance to the shock in the bonding connection step. Accordingly, the shock in the bonding connection step can be prevented from propagating to the sites of the layers below the current collecting electrodes D1, D2, which comprise the uppermost layer aluminum wires 4 of the input/output disposed in a lower layer of the current collecting electrodes D1, D2, the silicon nitride film 5 for insulating the uppermost aluminum wires 4, the silicon oxide film formed by the CVD method to insulate the uppermost aluminum wires 4 and the lower-layer aluminum wires 4, etc. Accordingly, the direct bonding connection to the current collecting electrodes D1, D2 can be performed. Furthermore, the current collecting electrodes D1, D2 are designed so that the copper-plated electrode 8 and the polyimide resin film 13 used as the final protection film are not brought into direct contact with each other. Therefore, the time-lapse degradation with respect to the adhesiveness of the polyimide resin film 13 shown in FIG. 28 is reduced, and high reliability under high temperature can be secured.

In the control circuit portion 3, the bonding pad P1 is disposed on the silicon nitride film 5 above the control circuit portion 3. The bonding pad P1 is connected through the opening portion formed in the silicon nitride film 5 to the aluminum wires 4 there under directly or with the wire 12 comprising the four layers of the first barrier layer 6, the copper seed layer 7, the second barrier layer 10 and the aluminum cap layer 11 as a drawing wire.

In the bonding pad P1, a copper-plated electrode 9 is formed on the silicon nitride film 5 serving as the fine protection film through the first barrier layer of titanium, titanium nitride, titanium tungsten or the laminate film thereof which has high adhesiveness to the silicon nitride film 5. The copper electrode 9 is designed so that the upper surface and whole side surface thereof are coated with the aluminum film (or aluminum alloy film) 11 through the second barrier layer 10 (aluminum cap layer), and has the same structure as the current collecting electrodes Dl, D2 of the power device portion 2. Accordingly, the bonding pad P1 based on the copper-plated electrode 9 has high reliability under high temperature as well as the high bonding connection performance and the high bonding shock resistance as in the case of the current collecting electrodes Dl, D2 of the power device portion 2. Furthermore, by using the wire 12 comprising the four layers as the uppermost connection wire between the circuits, the wiring efficiency can be enhanced, the area of the control circuit portion 3 can be saved. With respect to the drawing wire and the wire 12 between the circuits which are constructed by the four layers, at least the upper surfaces thereof are coated with the aluminum cap layer 11, and thus the diffusion of copper into the polyimide resin film 13 serving as the final protection film can be suppressed. Therefore, these wires have little time-lapse degradation with respect to the adhesion to the polyimide resin film 13 and high reliability.

Figure 4:
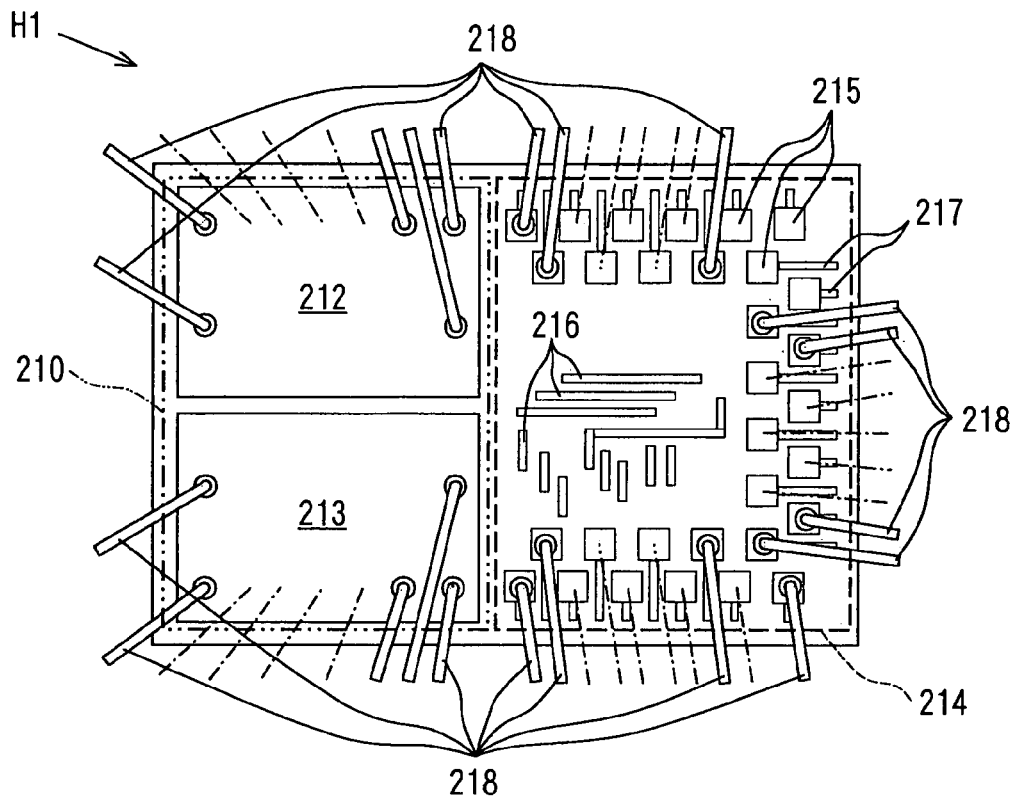
FIG. 4 is a diagram showing a planar style of the power composite integrated semiconductor device according to the first embodiment.

FIG. 4 is a schematic top view showing an example of the mount style using the wire bonding connection in the power composite integrated semiconductor device H1 of the present invention, and is a schematic top view.

Figure 13:
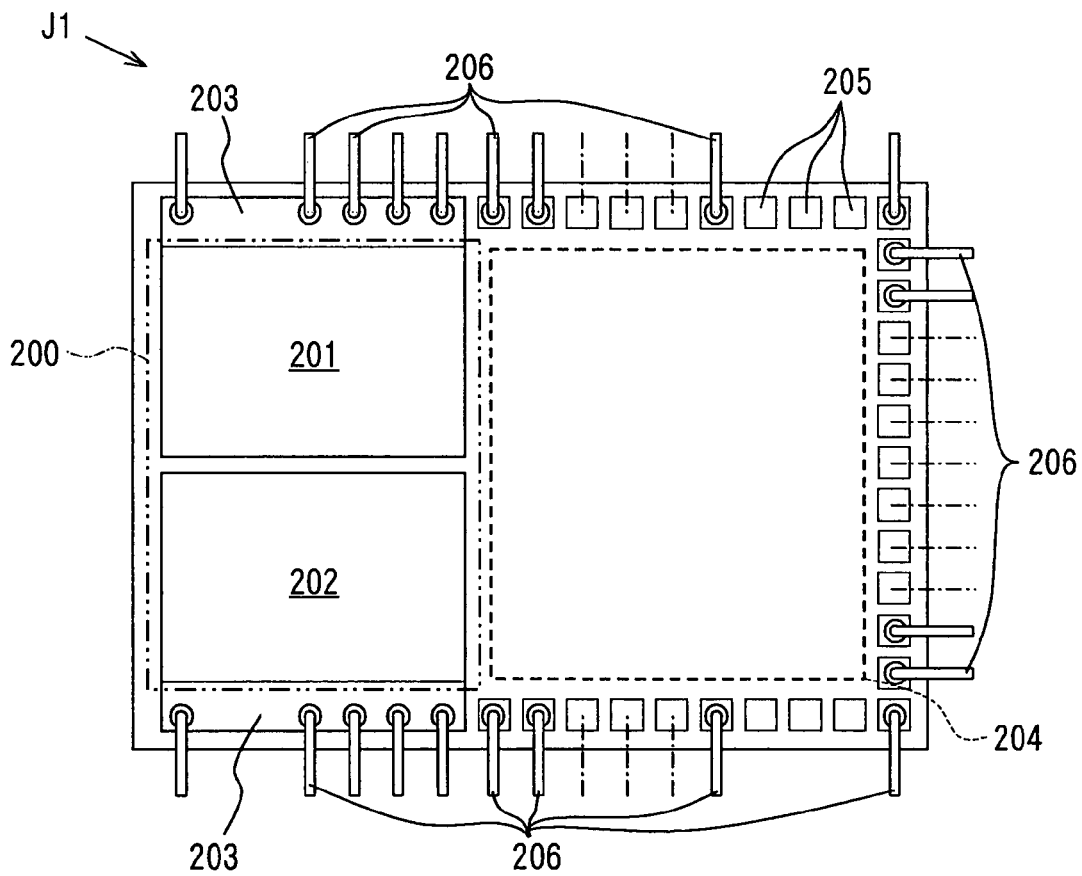
FIG. 13 is a diagram showing a mount style of the power composite integrated semiconductor device according to the first prior art.
Figure 14A:
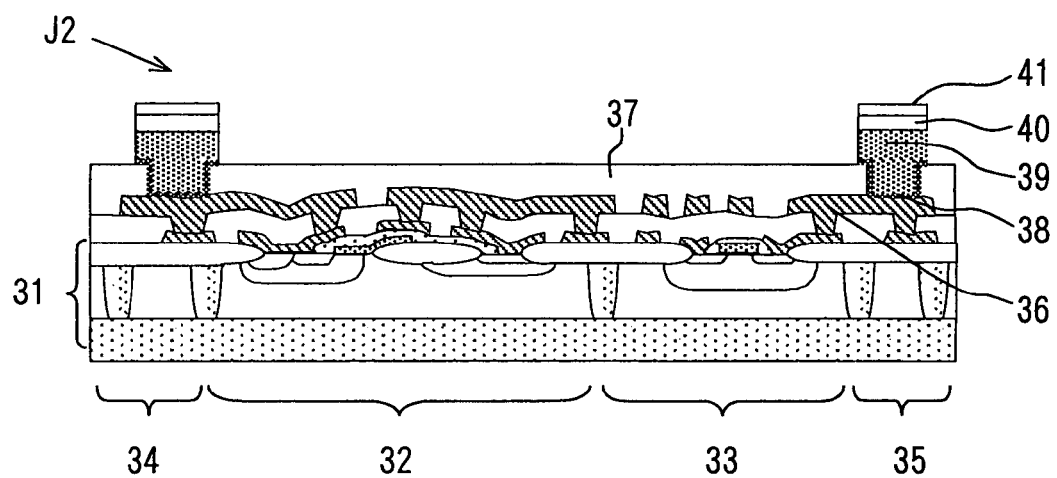
FIGS. 14A-14B are cross-sectional views showing a power composite integrated semiconductor device according to a second prior art.
Figure 14B:
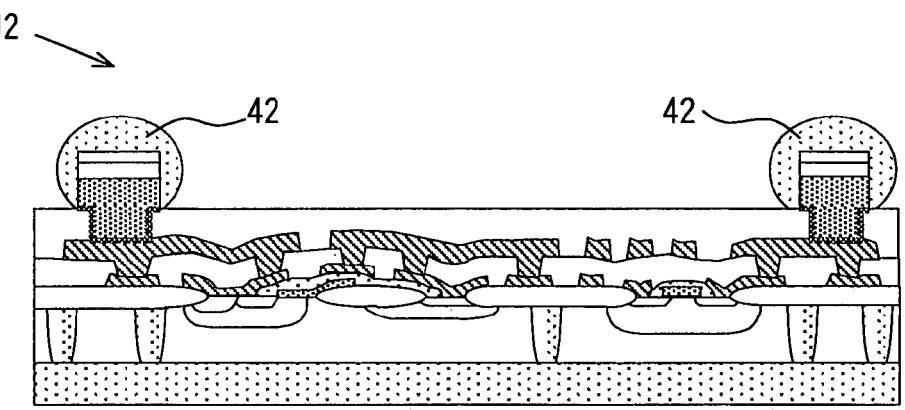
Figure 15A:
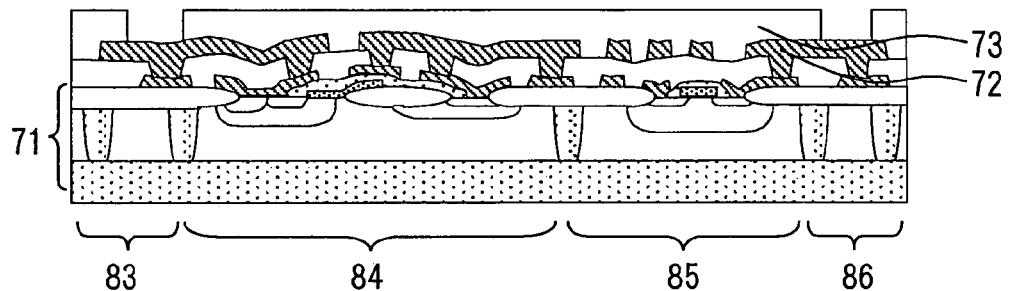
FIGS. 15A-15D are diagrams showing a method of manufacturing the power composite integrated semiconductor device according to a second prior art.
Figure 15B:
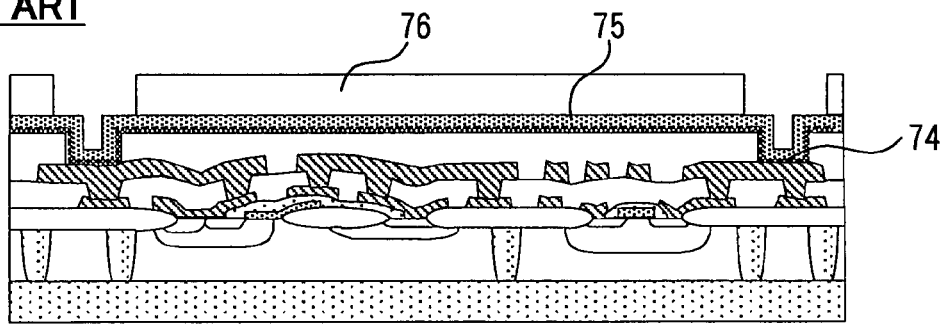
Figure 15C:
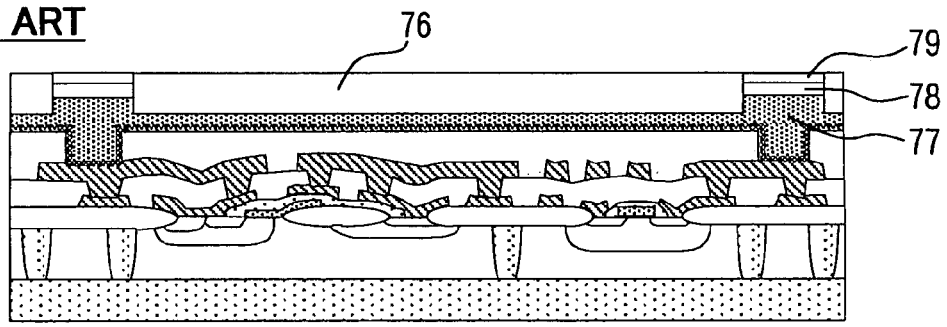
Figure 15D:
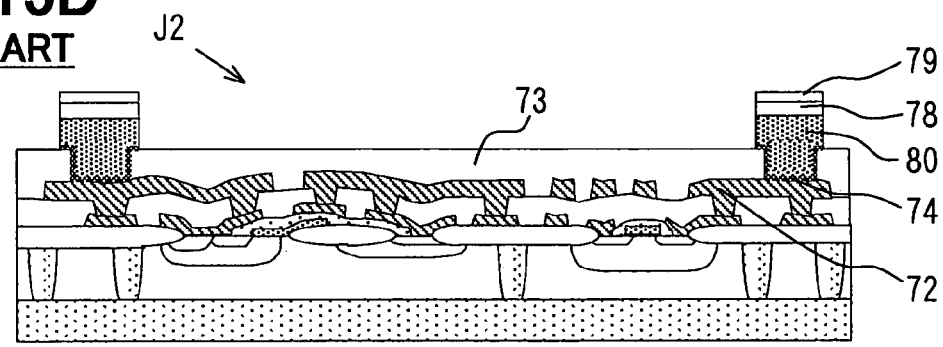
Figure 16:
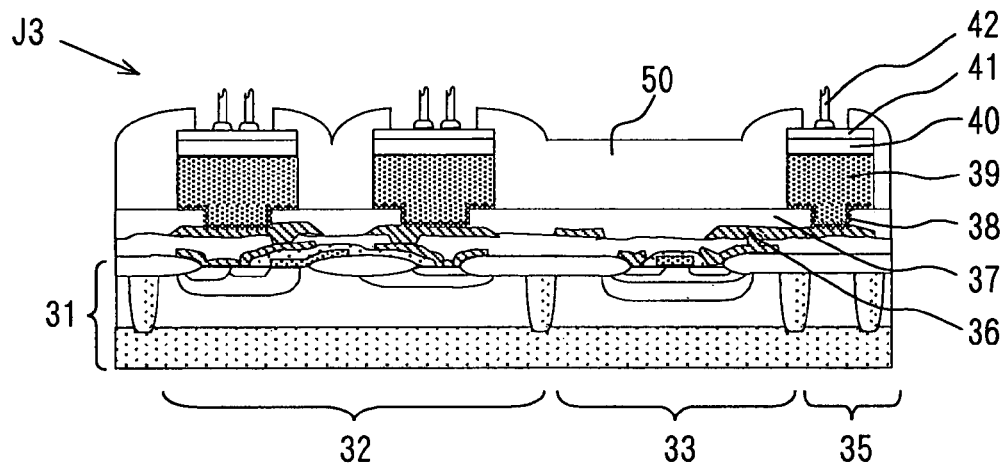
FIG. 16 is a cross-sectional view showing a power composite integrated semiconductor device according to a third prior art.
Figure 17:
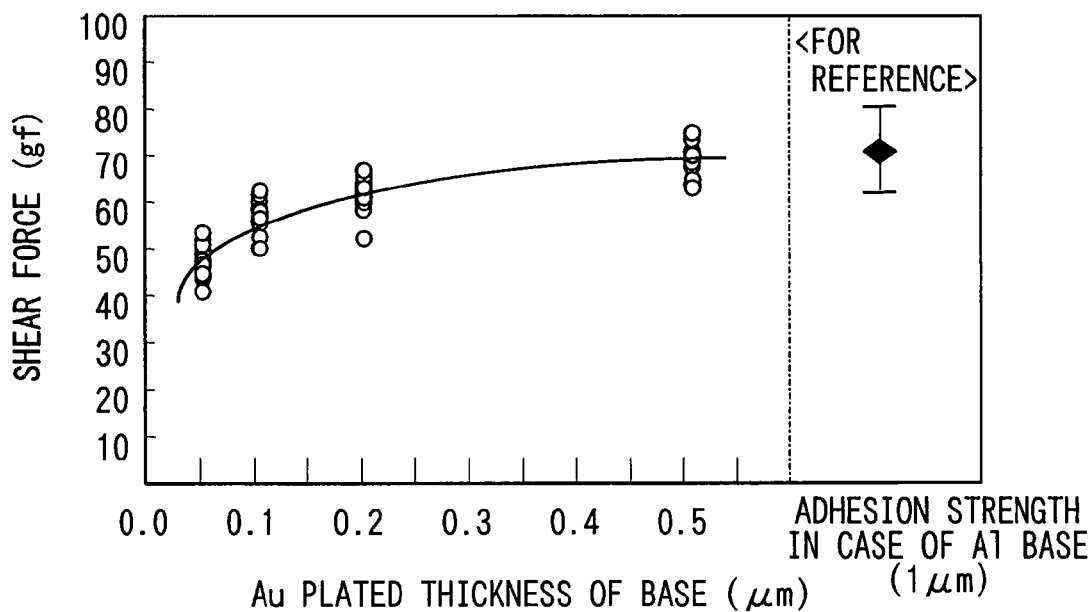
FIG. 17 is a diagram showing the bonding-connection strength with the underlying gold plating thickness.
Figure 18:
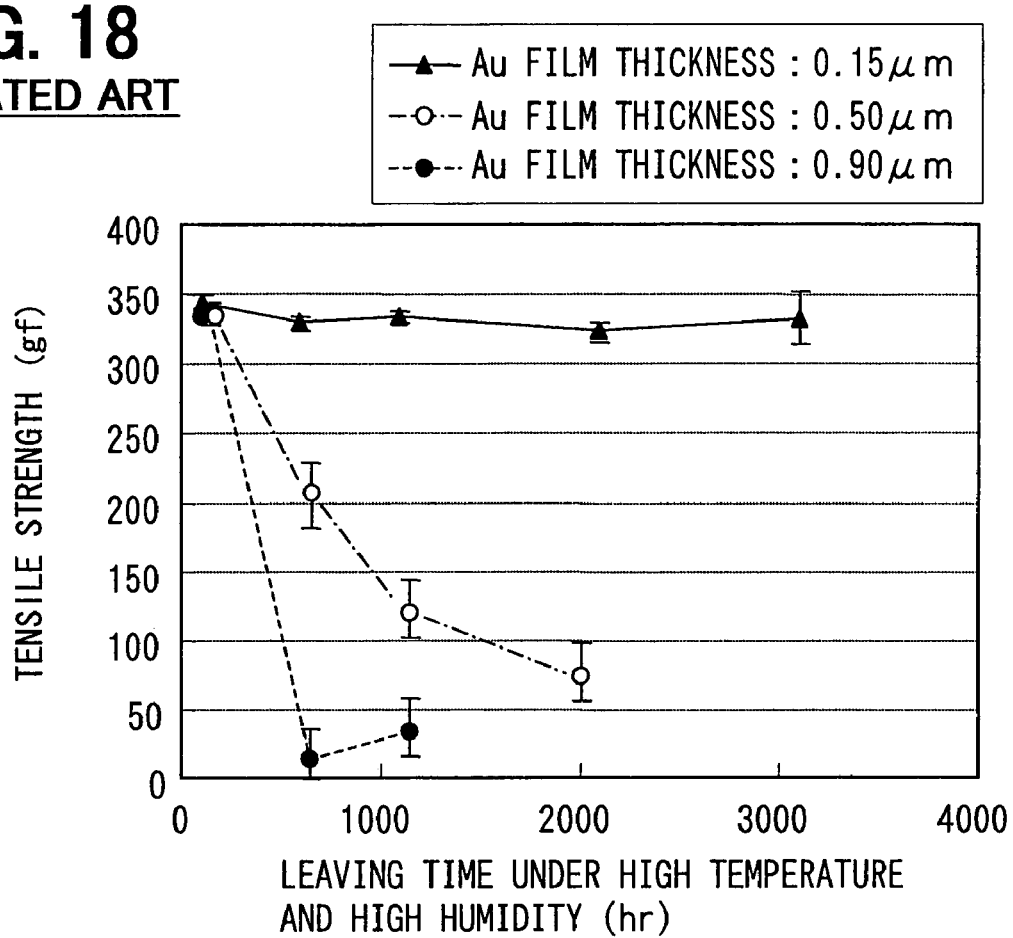
FIG. 18 is a diagram showing time-lapse variation of the bonding-connection strength.
Figure 19:
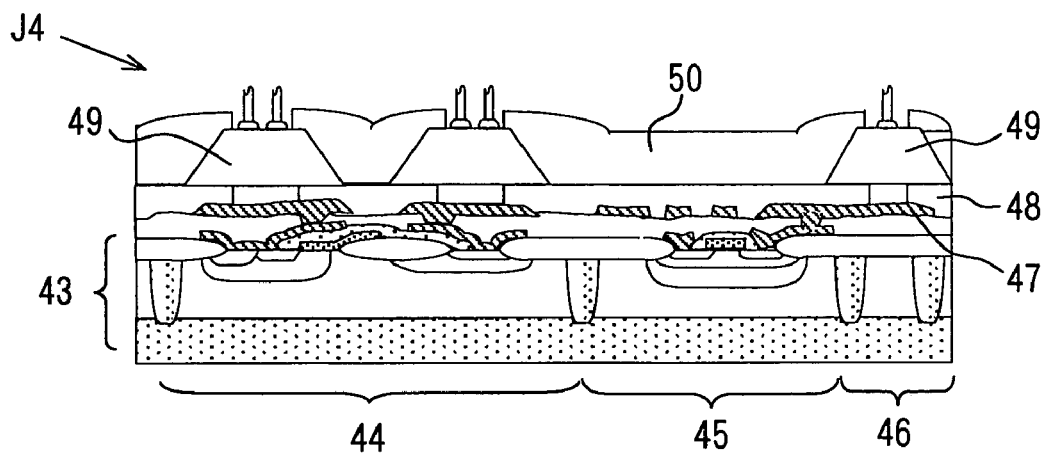
FIG. 19 is a cross-sectional view showing a power composite integrated semiconductor device according to a fourth prior art.
Figure 20A:
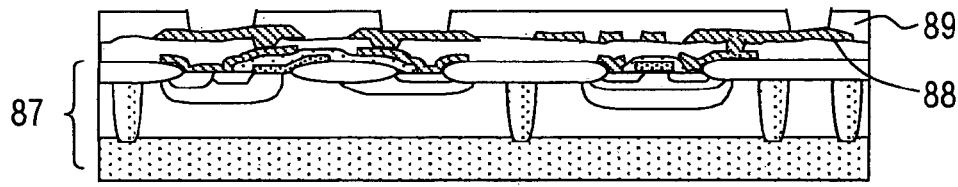
FIGS. 20A-20D are diagrams showing the method of manufacturing the power composite integrated semiconductor device according to the fourth prior art.
Figure 20B:
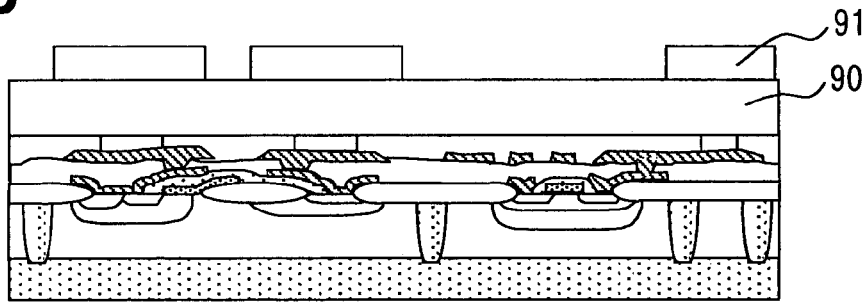
Figure 20C:
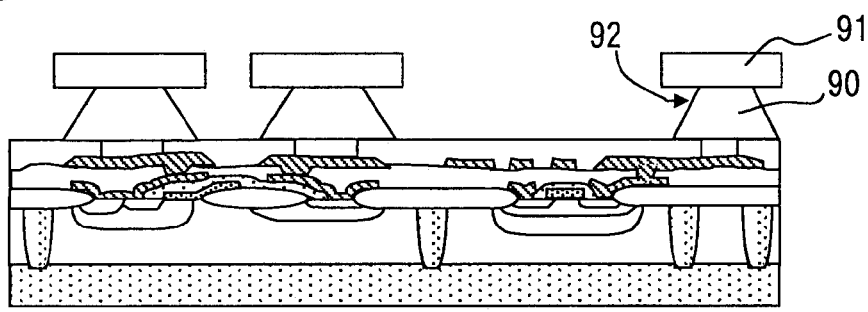
Figure 20D:
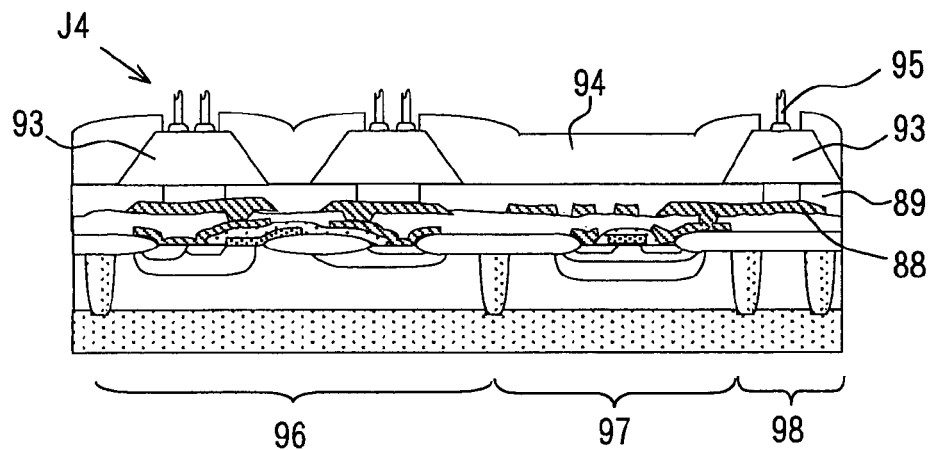
Figures 21, 22:
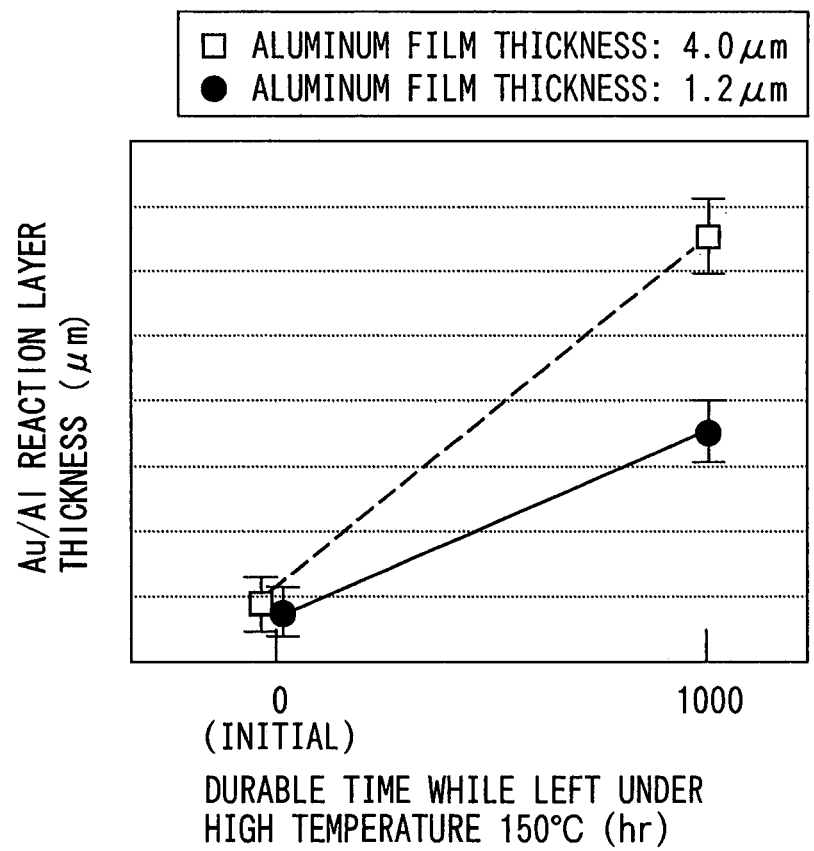
FIG. 21 is a diagram showing the mechanical strength of metal material.
FIG. 22 is a diagram showing the time-lapse variation of a gold/aluminum reaction layer.

By the effect described above, the direct bonding connection of each of the input and the output to the surface of the current collecting electrode 212, 213 can be performed in the power device portion 210 surrounded by a two-dotted chain line of the power composite integrated semiconductor device H1 shown in FIG. 4. Furthermore, bonding pads 215 are also disposed at the upper side in the control circuit portion 214 surrounded by a broken line. As described above, the power composite integrated semiconductor device H1 of FIG. 4 reduces the dedicated pad area for bonding connection at the peripheral portion of the device below which no functional element is disposed and which has been needed in the conventional power composite integrated semiconductor device J1 of FIG. 13. Accordingly, miniaturization of the power composite integrated semiconductor device H1 can be implemented, and the manufacturing cost thereof can be reduced.

Second Embodiment

Figure 5:
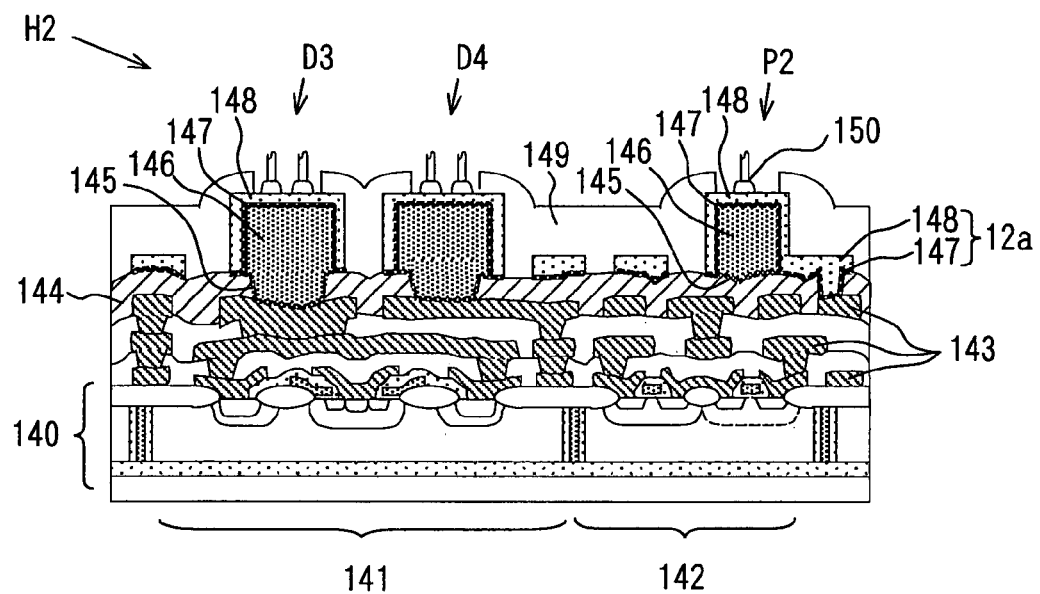
FIG. 5 is a cross-sectional view showing a power composite integrated semiconductor device according to a second embodiment.

FIG. 5 is a schematic diagram showing the cross-sectional structure of a power composite integrated semiconductor device H2 according to a second embodiment.

As in the case of the power composite integrated semiconductor device H1 shown in FIG. 1, the power composite integrated semiconductor device H2 shown in FIG. 5 is a power composite integrated semiconductor device in which a power device portion 141 having a power device formed therein and a control circuit portion 142 having a control circuit formed therein are arranged in a composite style on the surface layer portion of one silicon substrate 140. The device portion 141 and the control circuit portion 142 are wire-connected by first wires 143 formed of aluminum or aluminum alloy disposed on the silicon substrate 140 so as to perform desired control.

Silicon nitride film 144 is formed as insulating film for coating and protecting the first wires 143 on the silicon substrate 140. The silicon nitride film 144 is greatly opened at the power device portion 141 so that each of the input and the output can collect current on the first wires 143, and also it is opened at at least a portion for taking out the input/output of the control circuit at the control circuit portion 142.

In the power device portion 141 of the power composite integrated semiconductor device H2 shown in FIG. 5, current collecting electrodes D3 and D4 comprising thick-film copper electrodes 146 connected to the first wires 143 at the lower side through the first barrier layer 145 are disposed at the opening portions for the current collection of the input and the output. The first barrier layer 145 is formed of titanium, titanium nitride, titanium tungsten or the laminate film thereof. The thick-film copper electrodes 146 are formed at a thickness of 2 to 8 µm by electroplating, and the upper surface thereof and the whole side surface thereof, which contains the end portion of the first barrier layer 145 exposed onto the silicon nitride film 144, are perfectly coated with aluminum film of 0.8 to 1.0 µm (or aluminum alloy film) 148 through the second barrier layer 147 of 50 to 300 nm in thickness (aluminum cap layer). The second barrier 147 is also formed of titanium, titanium nitride, titanium tungsten or the laminate film thereof.

In the control circuit 142, a bonding pad P2 having the same structure as the current collecting electrodes D3, D4 of the power device portion 141 is disposed on the silicon nitride film 144 in an active region. That is, the bonding pad P2 comprises a copper electrode 146 which is formed at a thickness of 2 to 8 µm through the first barrier layer 145 by plating, and the upper surface of the copper electrode 146 and the whole side surface of the copper electrode, which contains the end portion of the first barrier layer 145 exposed onto the silicon nitride film 145, are perfectly coated with aluminum film (aluminum alloy film) 148 through the second barrier layer 147 (aluminum cap layer).

Furthermore, in order to take out the input/output of the control circuit, wires for connecting the first wires 143 to the bonding pad P2 are constructed through the opening formed in the silicon nitride film 144 by second wires 12a which are achieved by laminating the two layers of the second barrier layer 147 and the aluminum film (or aluminum alloy film) 148. Second wires 12a for connecting the circuits are formed on the silicon nitride film 144 as occasion demands.

Furthermore, protection film 149 for coating and protecting the uppermost surface is formed on the silicon substrate 140. The protection film 149 is formed of thick polyimide resin film, and it is opened at only the portions needed for the bonding connection of gold wires 150 in the areas where the current collecting electrodes D3 and D4 and the bonding pad P2 are formed.

FIGS. 6A to 6D and FIGS. 7A to 7D are cross-sectional views showing the steps of a manufacturing method of the integrated semiconductor device H2 of FIG. 5.

Figure 6A:
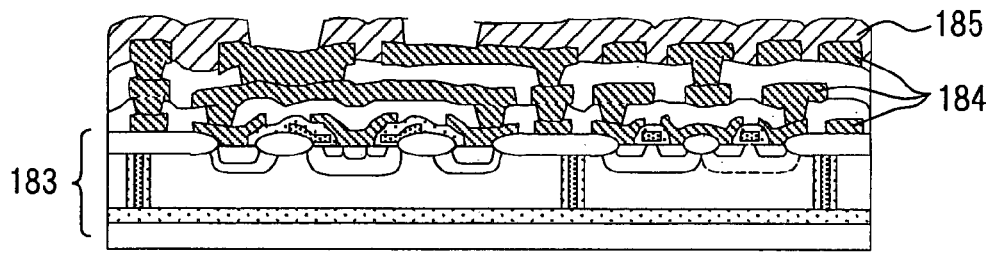
FIGS. 6A-6D are diagrams showing a method of manufacturing the power composite integrated semiconductor device according to a second embodiment.

First, as shown in FIG. 6A, the silicon substrate 183 in which the power device and the control circuit are arranged in a composite style is wire-connected by aluminum (alloy) wires 184 so as to perform desired control. Subsequently, silicon nitride film 185 of 1.0 to 1.8 µm in thickness is formed as insulating film for coating and protecting the aluminum wires 184 on the silicon substrate 183. The silicon nitride film 185 is greatly opened at the power-device formed portion so that each of the input and the output can collect current on the aluminum wires 184.

Figure 6B:
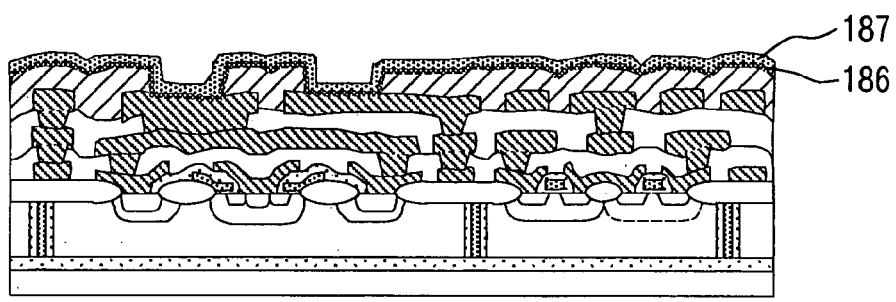

Subsequently, as shown in FIG. 6B, a first barrier layer 186 formed of titanium, titanium nitride, titanium tungsten or the laminate film thereof at a thickness of 50 to 300 nm is formed on the silicon nitride film 185 so as to cover the opening portions in the silicon nitride film 185. Subsequently, a copper seed layer 187 of 0.1 to 1.0 µm is continuously formed under vacuum.

Figure 6C:
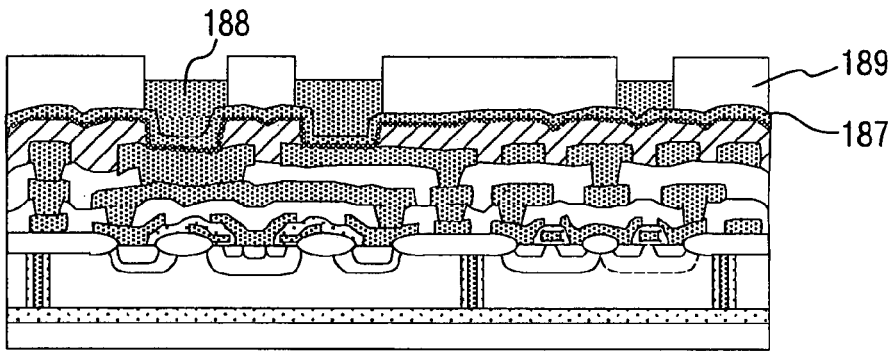

Subsequently, a resist 189 of about 10 µm in thickness is formed so as to be opened at portions where thick-film electrodes are formed by the photolithography technique as shown in FIG. 6C. A copper-plated layer 188 of 2 to 7 µm is formed at the opening portion of the resist 189 with the resist 189 as a mask and the copper seed layer 187 as an electrode by the electroplating technique which is low in manufacturing cost. The copper-plated layer 188 finally becomes a thick-film copper (plated) electrode 190.

Figure 6D:
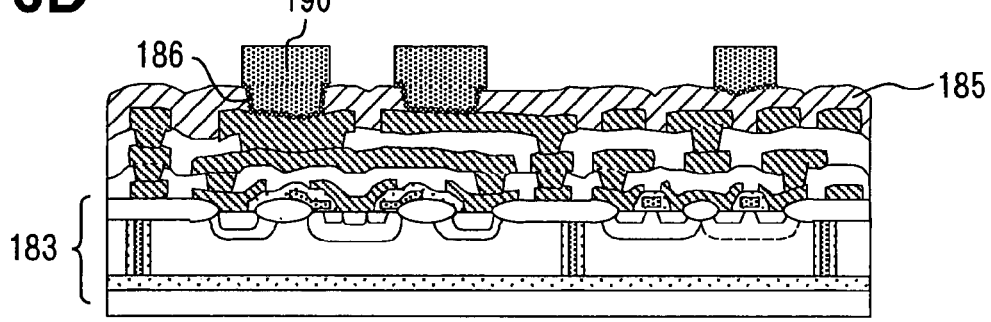

Subsequently, as shown in FIG. 6D, the resist 189 serving as the mask in the plating step is removed, and then an etching treatment is carried out with no mask to thereby remove unnecessary portions of the first barrier layer 186 and copper seed layer 187.

Figure 7A:
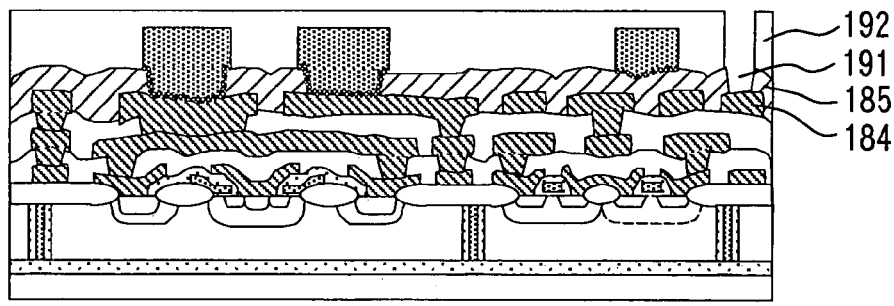
FIG. 7A-7D are diagrams showing the method of manufacturing the power composite integrated semiconductor device according to the second embodiment.

Subsequently, as shown in FIG. 7A, a wire draw-out hole 191 for connection to the aluminum wire 184 located at the lower side is formed in the silicon nitride film 185 by using the resist 192 as a mask.

Figure 7B:
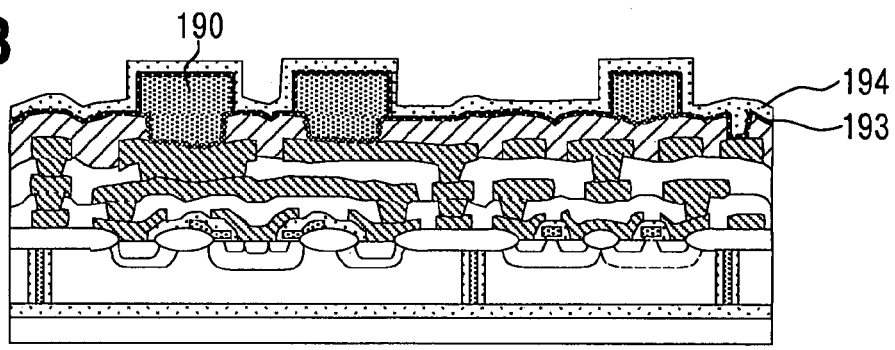

Subsequently, as shown in FIG. 7B, after the resist 192 is removed, a second barrier layer 193 which is formed of titanium, titanium nitride, titanium tungsten or the laminate film thereof at a thickness of 50 to 300 nm is formed on the whole surface of the silicon substrate 183 so as to perfectly cover the upper surface and whole side surface of the thick-film copper-plated electrode 190. Furthermore, an aluminum cap layer 194 of aluminum or aluminum alloy is continuously formed at a thickness of 0.8 to 1.5 µm on the whole surface of the silicon substrate 183 under vacuum so as to cover the whole of the copper-plated electrode 190 as in the case of the second baffler layer 193.

Figure 7C:
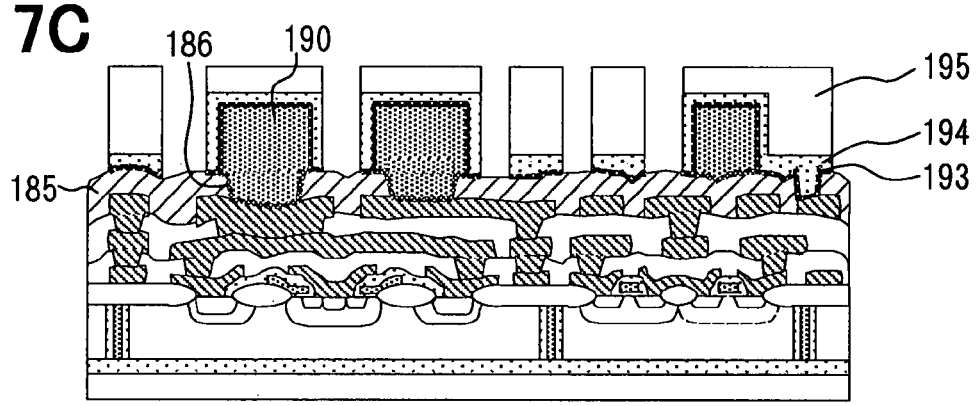

Subsequently, as shown in FIG. 7C, a resist 195 is formed by patterning so as to perfectly cover the thick-film copper-plated electrode 190 and so that a laminate portion of the two layers of the second barrier layer 193 and the aluminum cap layer 194 can be used as wires. By using the resist 195 as a mask, unnecessary portions of the second barrier layer 193 and the aluminum cap layer 194 are removed by etching.

Accordingly, there are formed the thick-film copper-plated electrode 190 which are perfectly coated with the aluminum cap layer 194 through the second barrier layer 193 on the upper surface thereof and on the whole side surface thereof which contains the end portion of the first barrier layer 186 exposed onto the silicon nitride film 185, and the second wires formed by laminating the two layers of the second barrier layer 193 and the aluminum cap layer 194.

Figure 7D:
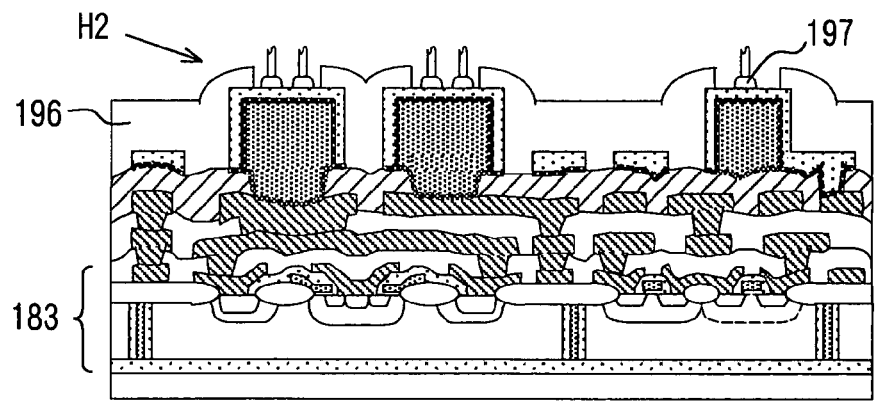

Finally, as shown in FIG. 7D, after the resist 195 used as the mask is removed, and the uppermost surface of the silicon substrate 183 is coated/protected by polyimide resin film 196. The polyimide resin film 196 is opened at only portions needed for the bonding connection, and gold wires 197 are bonded to the opening portions.

The power composite integrated semiconductor device H2 shown in FIG. 5 is manufactured as described above.

The power composite integrated semiconductor device H2 of FIG. 5 manufactured according to the above manufacturing method has the structure that the thick-film copper-plated electrodes 146 formed by the electroplating technique which is low in manufacturing cost are used as the current collecting electrodes D3 and D4 of the input/output of the power device portion 141. Therefore, the wire resistance of the power device can be reduced.

The current collecting electrodes D3, D4 are designed so that the upper surface of the copper-plate electrode 146 and the whole side surface of the copper-plated electrode 146 which contains the end portion of the first barrier layer 145 exposed onto the silicon nitride film 144 are perfectly coated with the aluminum cap layer 148 of 0.8 to 1.5 μm in thickness. Accordingly, the diffusion of copper into the polyimide resin film 149 and the degradation phenomenon caused by corrosion of copper do not occur, and thus high reliability can be secured. In the control circuit portion 142, the bonding pad P2 has the same structure as the current collecting electrode D3, D4 of the power device portion 141. As described above, the current collecting electrodes D3, D4 based on the copper-plated electrodes 146 and the bonding pad P2 have high reliability under high temperature in addition to high bonding connection performance and high bonding shock resistance as in the case of the power composite integrated semiconductor device H1 of the first embodiment.

In the power composite integrated semiconductor device H2 shown in FIG. 5, the wire 12a constructed by the two layers is used as the uppermost layer connecting wire between the circuits, so that the wiring efficiency can be enhanced and the area saving can be performed as in the case of the power composite integrated semiconductor device H according to the first embodiment.

The mounting style using the wire bonding connection in the power composite integrated semiconductor device H2 of FIG. 5 is the same style as shown in the schematic top view of the power composite integrated semiconductor device H1 shown in FIG. 4 according to the first embodiment. Accordingly, in the power composite integrated semiconductor device H2 of FIG. 5, the current collecting electrodes D3, D4 and the bonding pad P2 are also disposed on the active regions of the power device portion 141 and the control circuit portion 142 respectively to perform direct bonding connection. Accordingly, the dedicated pad area of the device peripheral portion below which no functional element is disposed to perform the bonding connection and which is needed in the conventional power composite integrated semiconductor device J1 of FIG. 13 can be reduced. Accordingly, the miniaturization of the power composite integrated semiconductor device H2 can be implemented, and the manufacturing cost thereof can be reduced.

Third Embodiment

Before describing a third embodiment, the technique of forming the thick-film copper electrode by electroplating which is described in the first embodiment and the second embodiment will be described in more detail.

Electroplating using a resist or the like as a mask is generally used as a method of forming a thick-film electrode of copper having small specific resistance. In the mask plating, a planar copper electrode having high processing precision can be achieved by using a resist having high dimension precision as a mask.

Figure 8:
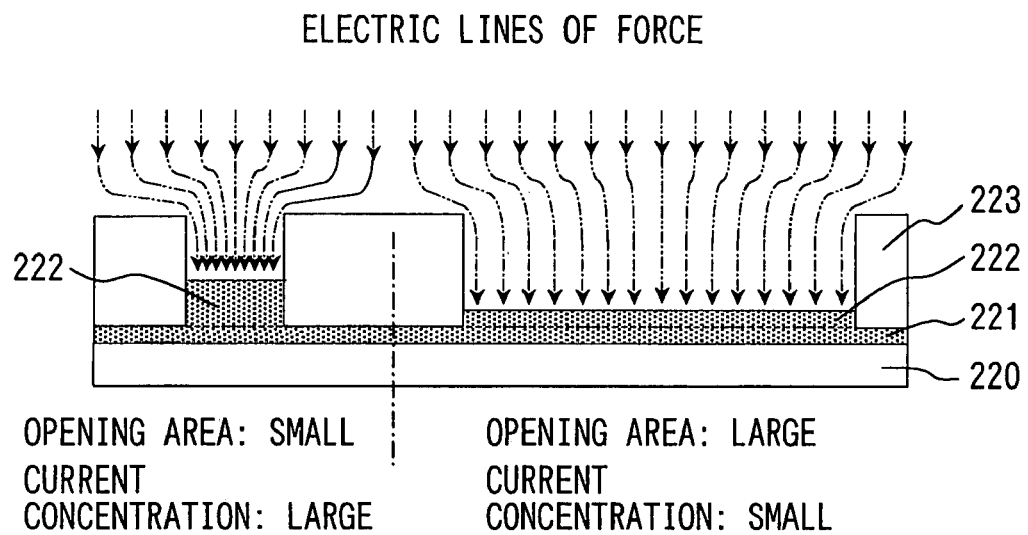
FIG. 8 is a diagram showing a current concentrated state in a copper electroplating step.
Figure 9:
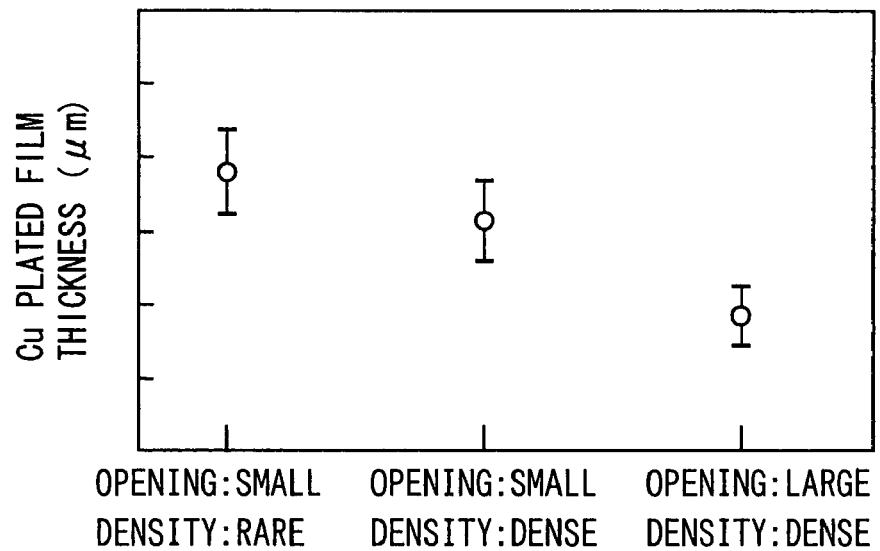
FIG. 9 is a diagram showing the dependence of copper thick film on opening size in the electroplating step.

FIG. 8 shows a current-concentrated state in the copper electroplating step. FIG. 9 shows the dependence of the film thickness of copper on the size of the opening.

As shown in FIG. 8, the current density in the electroplating step is varied in accordance with the area of the opening of the mask, and the current density is higher as the opening area is smaller. Due to the dependence of the current density on the opening area, there occurs a problem that the film thickness of plated copper is larger at a portion having a small opening area than that at a portion having a larger opening area.

In the power composite integrated semiconductor devices H1, H2 according to the first embodiment and the second embodiment, as shown in FIG. 4, the current collecting electrodes 212, 213 of the power device portion 210 are formed to be wide, and the bonding pads 215 disposed on the control circuit portion are formed to be small. Accordingly, when the thick-film copper-plated electrodes corresponding to the main constituent sites of the current collecting electrodes 212, 213 and the thick-film copper-plated electrodes corresponding to the main constituent sites of the bonding pads 215 are simultaneously formed with the resist as a mask by electroplating, the copper-plated electrodes constituting the small bonding pads 215 are thicker than the copper-plated electrodes constituting the wide current collecting electrodes 212, 213.

The thickness of the copper-plated electrodes is determined to implement the reduction of the current collection resistance of the current collecting electrodes, and thus the copper-plated electrodes constituting the bonding pads which are arbitrarily disposed on the control circuit are needlessly larger in thickness. Therefore, the coating performance of the polyimide resin film is lowered at the bonding pad portions. On the other hand, in order to secure the reliability of the whole power composite semiconductor device, it is required to surely coat the bonding pads with the polyimide resin film. Therefore, the film thickness of the polyimide film which is high in material cost must be increased, and thus the manufacturing cost is increased. Furthermore, in the wide current collecting electrode portion, dispersion occurs in the film thickness of the copper-plated electrode is liable to occur, and thus dispersion also occurs in the ON-resistance of the power device.

The power composite integrated semiconductor device according to this embodiment provides the structure for solving the problem caused by the dependence of the copper plating thickness on the opening area in the electroplating step.

Figure 10:
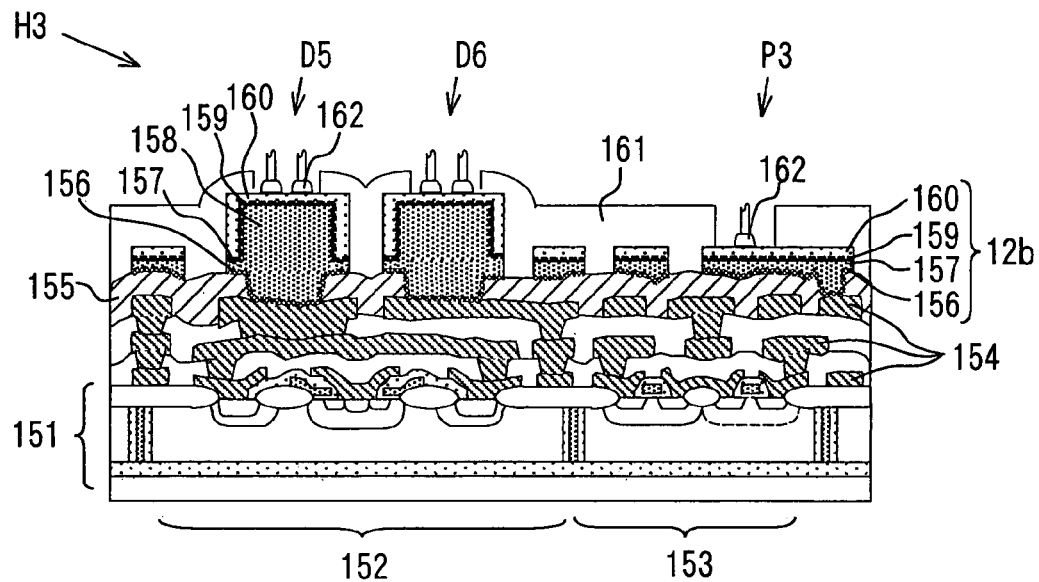
FIG. 10 is a cross-sectional view showing a power composite integrated semiconductor device according to a third embodiment.

FIG. 10 is a schematic diagram showing the cross-sectional structure of a power composite integrated semiconductor device H3 according to a third embodiment of the present invention.

The power composite integrated semiconductor device H3 shown in FIG. 10 is a power composite integrated semiconductor device in which a power device portion 152 having a power device and a control circuit portion 153 having a control circuit are arranged on the surface layer portion of one silicon substrate 151 in a composite style as in the case of the power composite integrated semiconductor device H1 shown in FIG. 1. The power device portion 152 and the control circuit portion 153 are wire-connected by first wires 154 formed of aluminum or aluminum alloy arranged on the silicon substrate 151 so that desired control can be performed.

Furthermore, protection film 155 achieved by laminating silicon oxide film and silicon nitride film so that the silicon nitride film serves as an upper layer is formed as insulating film for coating and protecting the first wires 154 on the silicon substrate 151. The protection film 155 is greatly opened at the power device portion 152 so that the input/output can collect current on the first wires 154, and it is opened at at least a portion for taking out the input/output of the control circuit at the control circuit portion 153. The step between the protection film 155 and the layer of the aluminum wire 154 there under at the opening portion is set to 1.0 to 1.8 µm.

In the power device portion 152 of the power composite integrated semiconductor device H3 shown in FIG. 10, current collecting electrodes D5, D6 formed of thick-film copper electrodes 158 connected to the first wires 154 there under through the first baffler layer 156 are disposed at the opening portions for the current collection of the input and the output. The first barrier layer 156 is formed of titanium, titanium nitride, titanium tungsten or the laminate film thereof. The thick-film copper electrode 158 is formed at a thickness of 2 to 8 µm by electroplating, and it is designed so that the upper surface and the whole side surface thereof are coated with aluminum film (or aluminum alloy film) of 0.8 to 1.5 µm in thickness through a second barrier layer 159 of 50 to 300 nm in thickness (aluminum cap layer). The second barrier layer 159 is also formed of titanium, titanium nitride, titanium tungsten or the laminate film thereof.

In the control circuit portion 153, a bonding pad P3 is disposed on a protection film 155 in an active region, however, it has a structure different from the current collecting electrodes D5, D6 of the power device portion 152. That is, the bonding pad P3 has no thick-film copper (plated) electrode 158 formed therein and has the same structure as the second wire 12b for taking out the input/output of the control circuit. The second wire 12b has a structure achieved by laminating the four layers of a first barrier layer 156, a thin copper wiring layer (copper seed layer) 157 of 0.1 to 1.0 µm in thickness, the second barrier layer 159 and aluminum film (or aluminum alloy film) 160. The first wires 154 and the bonding pad P3 are connected through an opening formed in the protection film 155. A second wire 12b for connecting the circuits may be formed on the protection film 155 as occasion demands.

In the structure of the power composite integrated semiconductor device H3 shown in FIG. 10, the copper-plated electrodes 158 are formed at only the wide current collecting electrodes D5, D6, so that the dispersion in film thickness of the copper-plated electrodes 158 constituting the current collecting electrodes D5, D6 can be reduced, and the dispersion in ON-resistance of the power device can be also reduced. Furthermore, in the power composite integrated semiconductor device H3, the high steps on the protection film 155 are formed at only the current collecting electrode D5, D6 portions. Therefore, the film thickness of the polyimide resin film 161 serving as the final protection film may be sufficient to the extent that the current collecting electrodes D5, D6 are coated with the polyimide resin film 161, and it is not necessary to excessively increase the film thickness of the polyimide resin film 161, so that the manufacturing cost can be reduced.

With respect to the shock in the bonding step, the bonding pad P3 disposed on the control circuit portion 153 is constructed by the above four layers which contain the first barrier layer 156 having excellent adhesion to the silicon nitride film serving as the upper layer of the protection film 155. Accordingly, the shock is absorbed by the aluminum cap layer 160, and the under layer aluminum wire 154 and the interlayer insulating layer formed of the CVD oxide film are protected from the shock in the bonding step by the copper seed layer 157 having high mechanical strength, the first barrier layer 156 and the silicon nitride film serving as the upper layer of the protection film 155. Therefore, the power composite integrated semiconductor device H3 of FIG. 10 has high bonding-connection performance and high bonding shock resistance.

Figure 11:
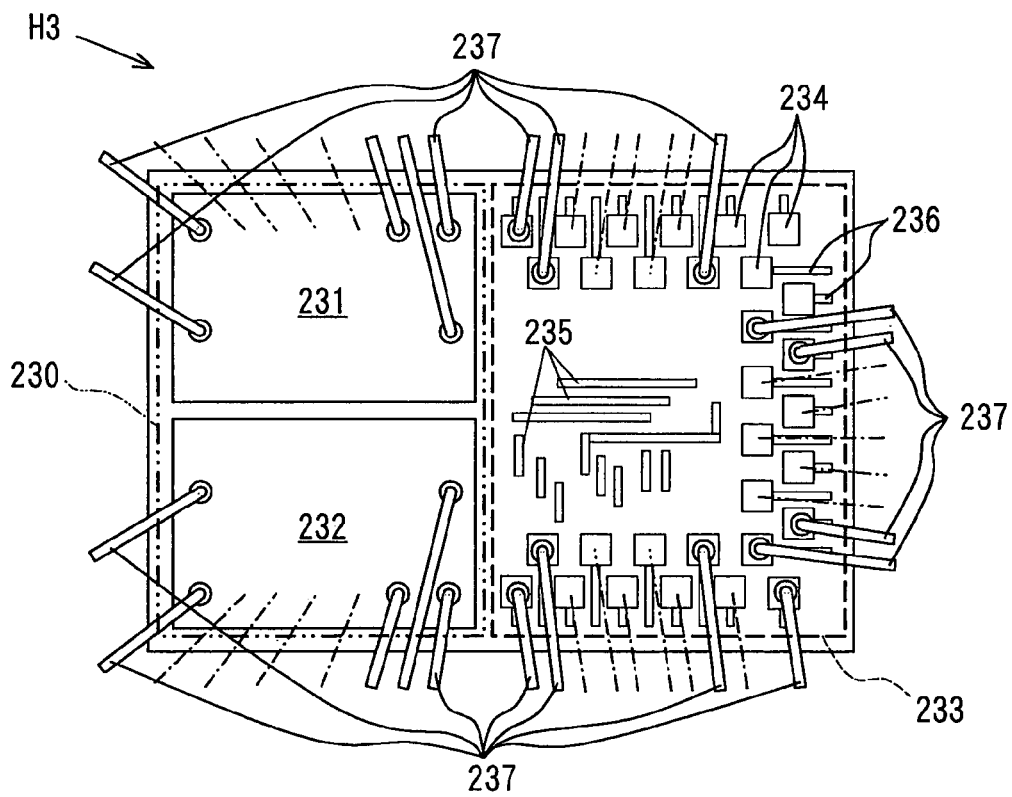
FIG. 11 is a diagram showing a plan style of the power composite integrated semiconductor device according to the third embodiment.
Figure 12:
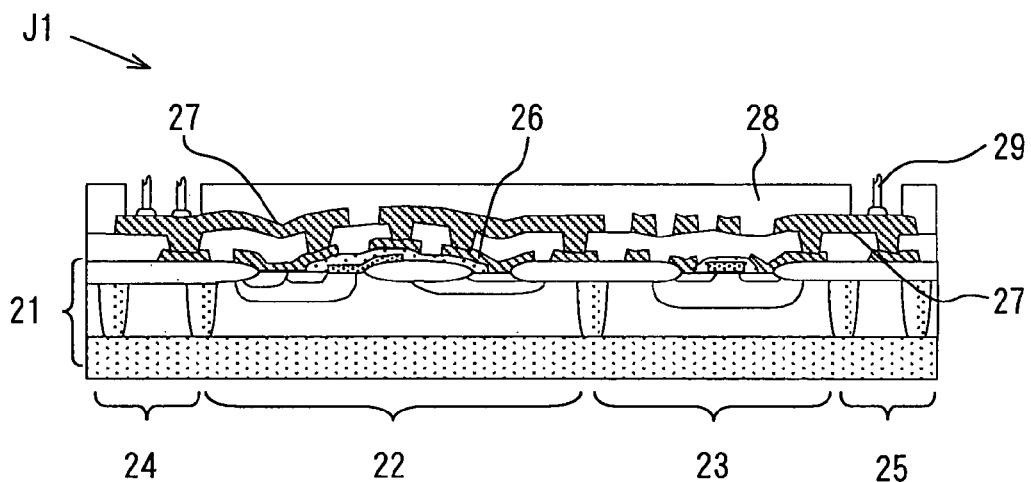
FIG. 12 is a cross-sectional view showing a power composite integrated semiconductor device of a first prior art.

FIG. 11 is a schematic top view showing an example of a mount style using wire bonding-connection in the power composite integrated semiconductor device H3.

Figure 23:
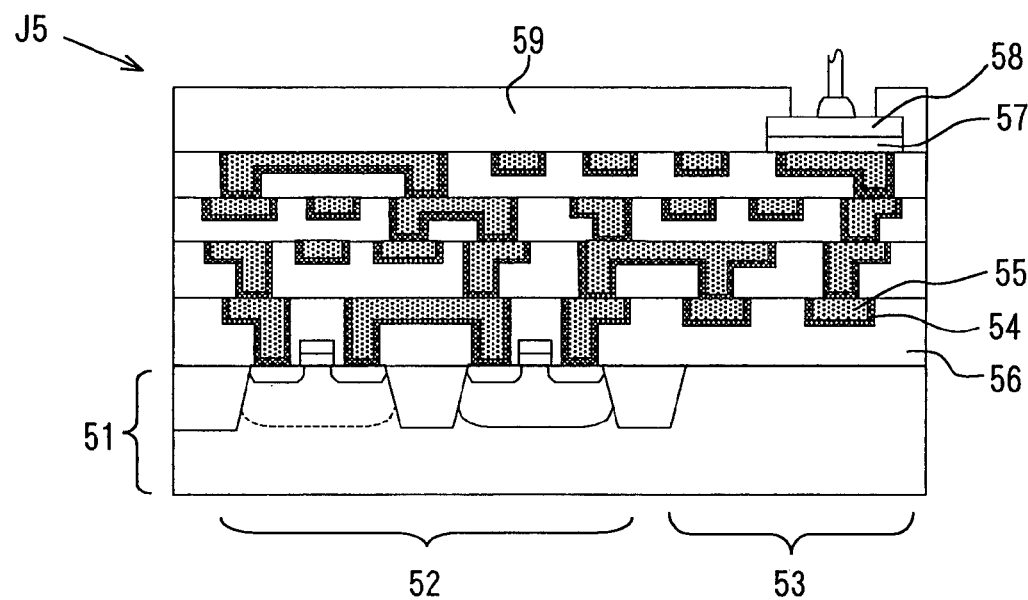
FIG. 23 is a cross-sectional view showing a power composite integrated semiconductor device according to a fifth prior art.
Figure 25:
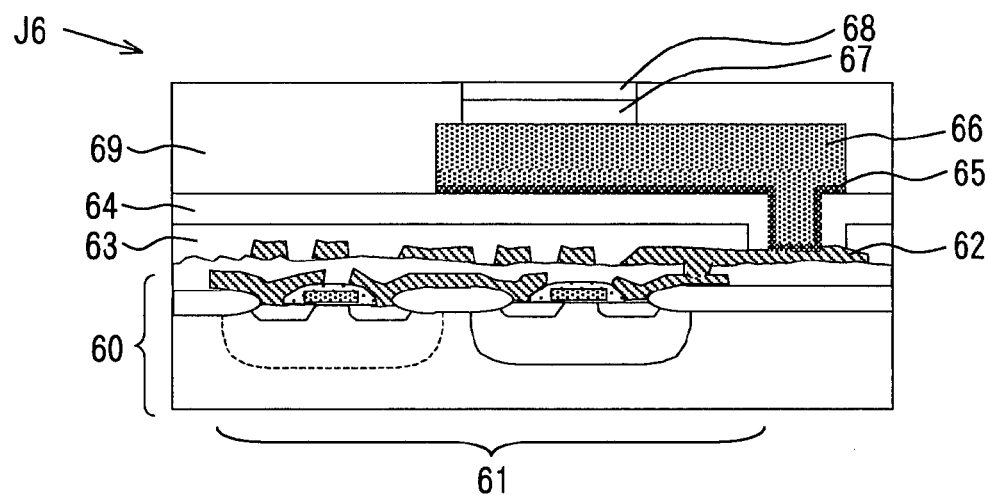
FIG. 25 is a cross-sectional view showing a power composite integrated semiconductor device according to a sixth prior art.
Figure 24A:
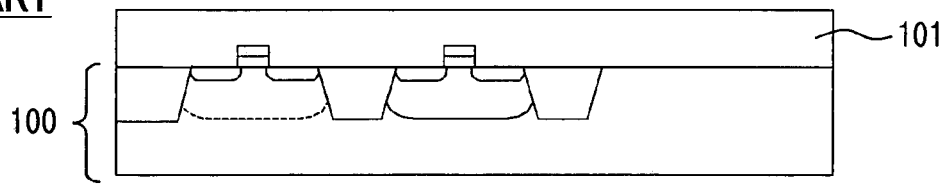
FIGS. 24A-24E is a diagram showing a method of manufacturing the power composite integrated semiconductor device according to a fifth prior art.
Figure 24B:
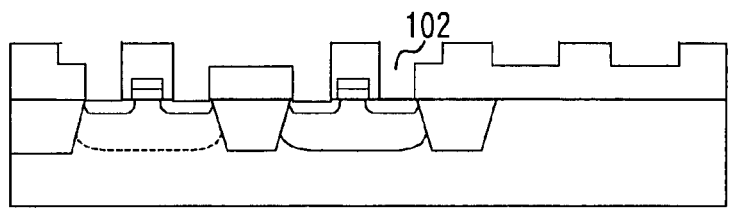
Figure 24C:
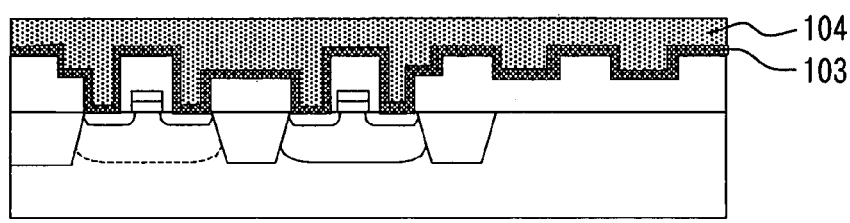
Figure 24D:
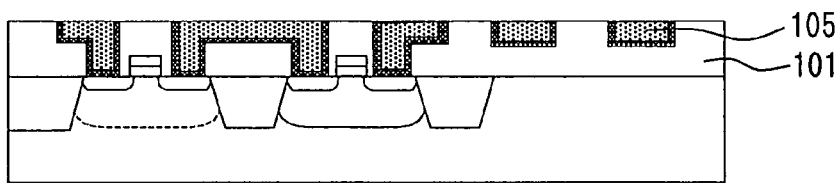
Figure 24E:
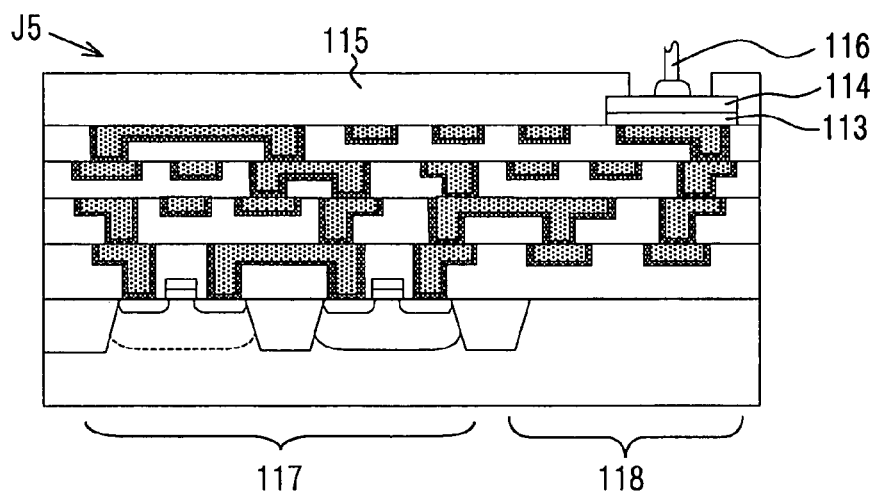
Figure 26A:
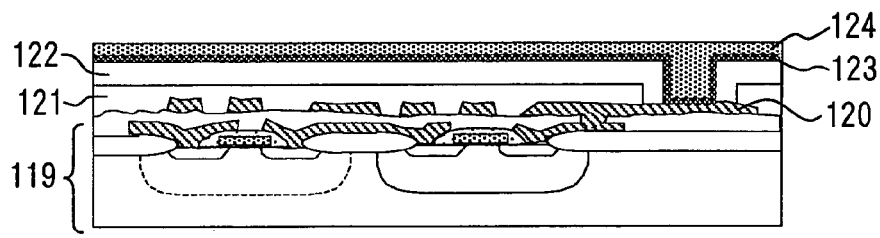
FIGS. 26A-26E are diagrams showing a method of manufacturing the power composite integrated semiconductor device according to the sixth prior art.
Figure 26B:
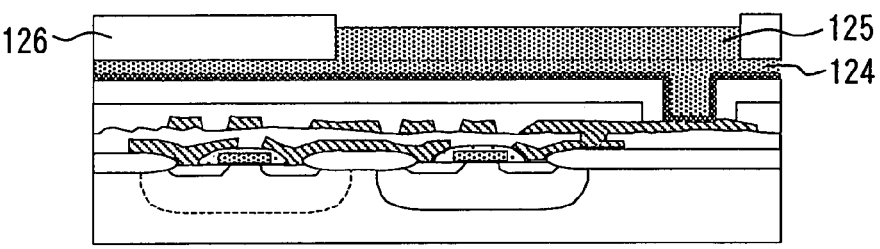
Figure 26C:
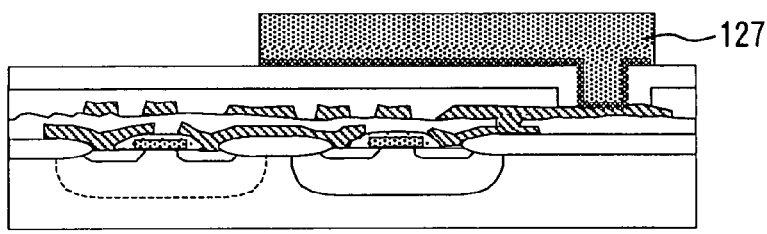
Figure 26D:
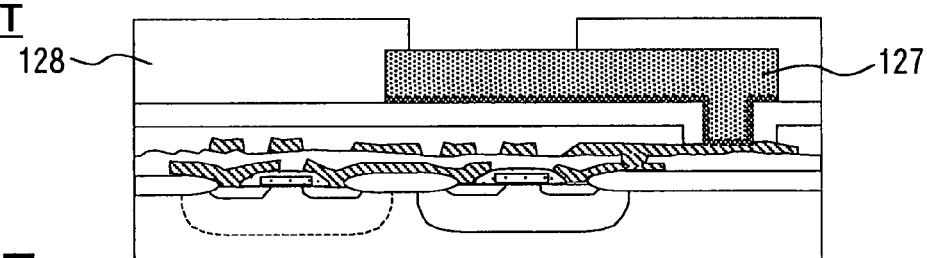
Figure 26E:
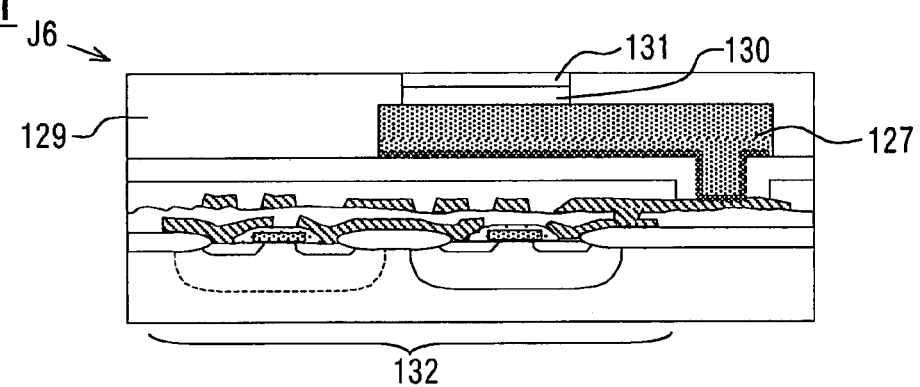
Figure 27:
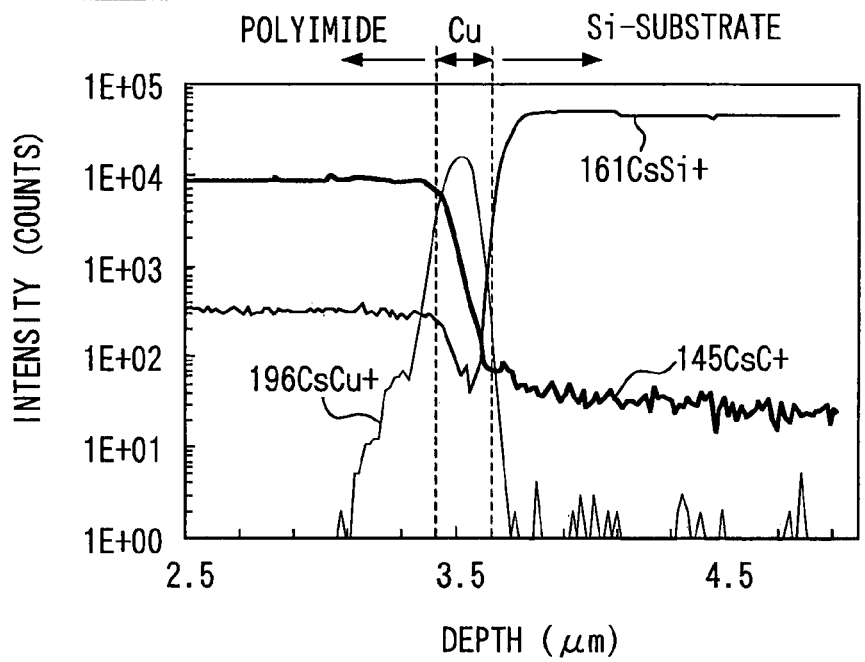
FIG. 27 is a diagram showing diffusion of copper into polyimide film.

By the same effect as described above with respect to the first embodiment and the second embodiment, the direct bonding-connection to the surfaces of the respective current collecting electrodes 231, 232 for the input and the output can be performed at the power device portion 230 surrounded by a two-dotted chain line of the power composite integrated semiconductor device H3 shown in FIG. 11. Furthermore, bonding pads 234 are arranged at the upper side of the control circuit portion 233 surrounded by a broken line. As described above, the power composite integrated semiconductor device H3 shown in FIG. 23 eliminates the dedicated pad area at the device peripheral portion below which no functional element is disposed to establish bonding-connection and which is needed in the conventional composite integrated semiconductor device J1 of FIG. 13. Accordingly, the miniaturization of the power composite integrated semiconductor-device H3 can be implemented, and the manufacturing cost thereof can be reduced.

Fourth Embodiment

Figure 29:
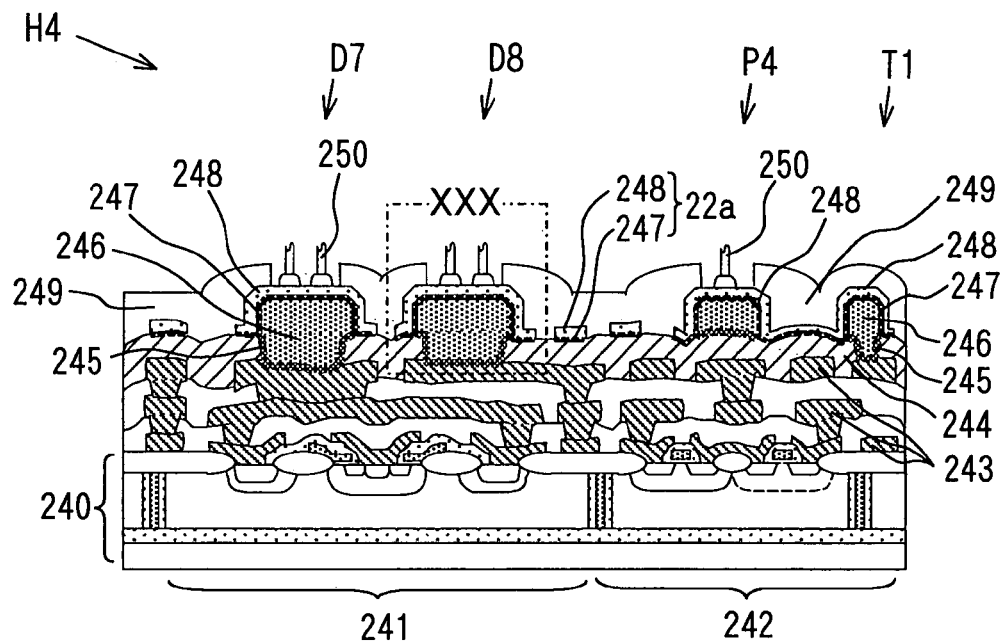
FIG. 29 is a cross-sectional view showing a power composite integrated semiconductor device according to a fourth embodiment.

FIG. 29 is a schematic diagram showing the cross-sectional structure of a power composite integrated semiconductor device H4 according to a fourth embodiment of the present invention.

As in the case of the power composite integrated semiconductor devices H1 to H3 according to the first to third embodiments, a power composite integrated semiconductor device H4 shown in FIG. 29 is a power composite integrated semiconductor device in which a power device portion 241 having a power device formed therein and a control circuit portion 242 having a control circuit formed therein are arranged on the surface layer portion of the silicon substrate 240. The power device portion 241 and the control circuit portion 242 are wire-connected by first wires 243 formed of aluminum or aluminum alloy so as to perform desired control.

Silicon nitride film 244 is formed as insulating film for coating and protecting the first wires 243. The silicon nitride film 244 is opened in the power device portion 241 so that each of the input and the output can collect current on the first wires 243, and it is also opened at least a portion for taking out the input/output of the control circuit in the control circuit portion 242.

In the power device portion 241 of the power composite integrated semiconductor device H4 shown in FIG. 29, current collecting electrodes D7, D8 comprising thick-film copper electrodes 246 connected to the first wires 243 there under through a first barrier layer 245 are disposed at the opening portions for the current collection of the input and the output.

The first barrier layer 245 is formed of titanium, titanium nitride, titanium tungsten or the laminate film thereof. The thick-film copper electrode 246 is formed at a thickness of 2 to 8 μm by electroplating, and it is designed so that the upper surface thereof and the whole side surface thereof which contains the end portion of the first barrier layer 245 exposed onto the silicon nitride film 244 are perfectly coated with aluminum film or aluminum alloy film 248 of 0.8 to 1.5 μm in thickness through a second barrier layer 247 of 50 to 300 nm in thickness (aluminum cap layer). The second barrier layer 247 is also formed of titanium, titanium nitride, titanium tungsten or the laminate film thereof.

Figure 30:
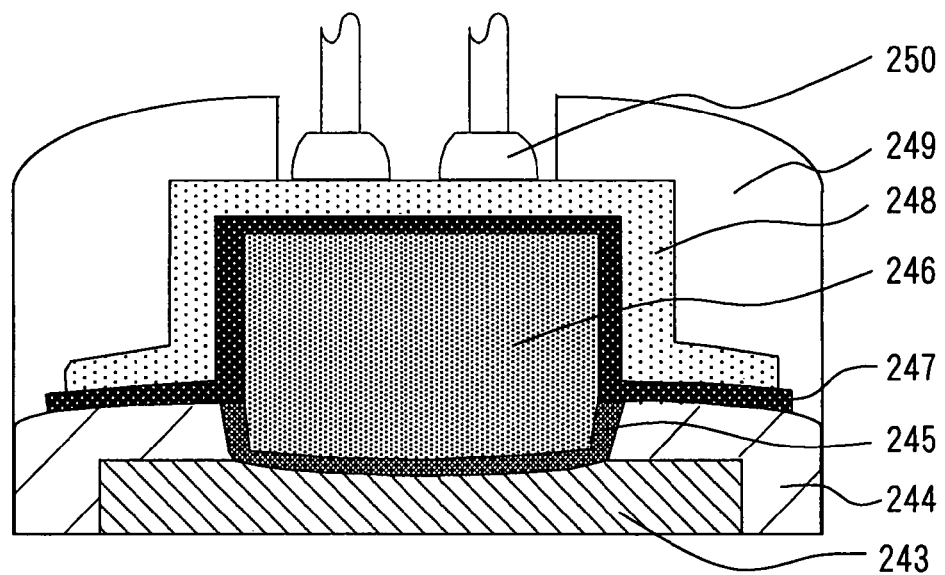
FIG. 30 is an enlarged view of a portion labeled XXX of FIG. 29.

FIG. 30 is an enlarged view of an XXX portion of FIG. 29.

At the current collecting electrodes D7, D8, the second barrier layer 247 and the aluminum film or aluminum alloy film 248 which are coated on the thick-film copper electrode 246 are processed so that the planar shapes thereof are larger in plane size than the planar shape of the thick-film copper electrode 246.

Accordingly, the thick-film copper electrode 246 is perfectly wrapped by the second barrier layer 247 and the aluminum film or aluminum alloy film 248.

The current collecting electrode is opened only in an area where bonding-connection should be performed later, and the whole thereof is coated with polyimide resin film 249.

FIG. 31 shows the physical properties of several kinds of polyimide resin which are generally used. It is apparent from water absorption percentages of a table shown in FIG. 31 that polyimide resin contains a minute amount of water.

In the current collecting electrode shown in FIG. 30, the thick-film copper electrode 246 is perfectly wrapped by the second barrier layer 247 and the aluminum film or aluminum alloy film 248, whereby diffusion of copper at high temperature and oxidation of the copper electrode 246 by the minute amount of water contained in the polyimide resin film 249 can be prevented when the device is used under high voltage or high temperature atmosphere, and high reliability can be secured.

FIGS. 32A-32D show the planar structure of the current collecting electrode D7, D8 which is more suitable for use under high voltage atmosphere.

Figure 32A:
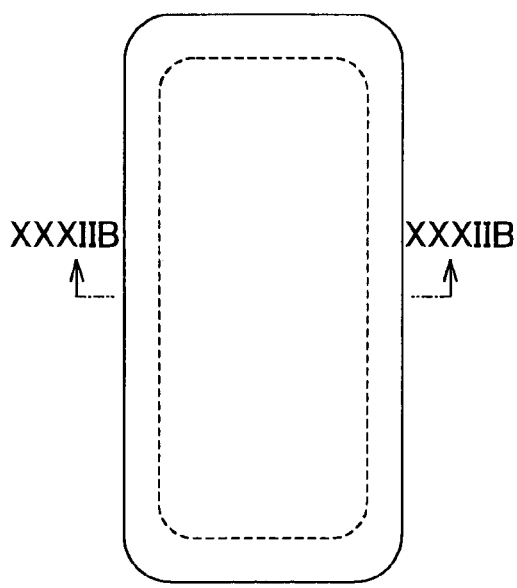
FIGS. 32A-32D are diagrams showing the structure of current collecting electrodes suitably used under high voltage.
Figure 32C:
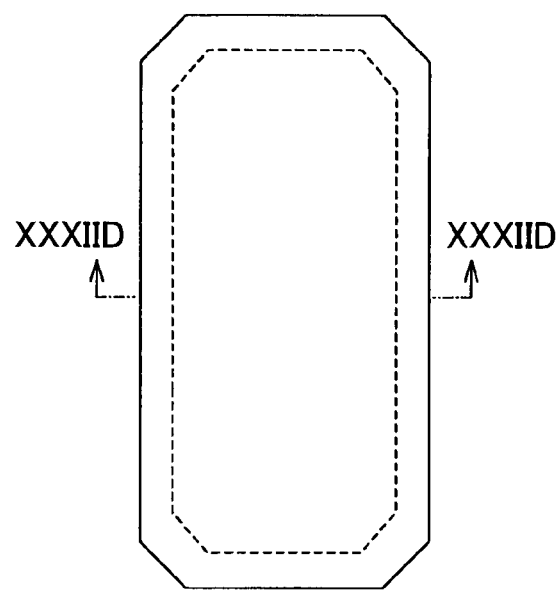
Figure 32B:
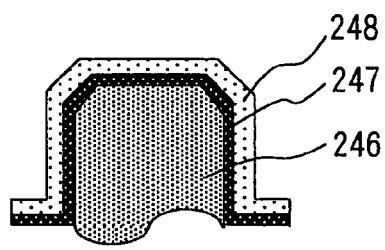

In the current collecting electrode of FIGS. 32A-32B, the copper electrode 246, the second barrier layer 247 and the aluminum film or aluminum alloy film 248 are chamfered at the corner portions thereof in cross-sectional view and rounded at the corner portions thereof in plan view.

Figure 32D:
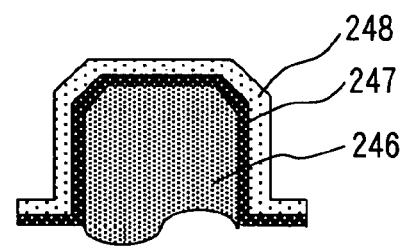

In the current collecting electrode shown in FIGS. 32C-32D, the copper electrode 246, the second barrier layer 247 and the aluminum film or aluminum alloy film 248 are chamfered at the corner portions thereof both in cross-sectional view and plan view.

By the structure shown in FIGS. 32A and 32C, the concentration of electric field on the corner portions of the current collecting electrodes is moderated even when a high voltage is applied, and higher reliability can be secured.

In the control circuit portion 242 of the power composite integrated semiconductor device H4 shown in FIG. 29, a bonding pad P4 having the same structure as the current collecting electrodes D7, D8 of the power device portion 241 is disposed on the silicon nitride film 244 located in the active region. That is, the bonding pad P4 comprises the copper electrode 246 formed at a thickness of 2 to 8 μm in thickness through the first barrier layer 245 by plating, and it is designed so that the upper surface of the copper electrode 246 and the whole side surface of the copper electrode 246 which contains the end portion of the first barrier layer 245 exposed onto the silicon nitride film 245 are perfectly coated with the aluminum film or aluminum alloy film 248 (aluminum cap layer) through the second barrier layer 247.

A pillar-shaped portion T1 having the same structure as the current collecting electrodes D7, D8 at the power device portion 241 is also formed on an opening formed in the silicon nitride film 244, and also wires for connecting the first wires 243 to the bonding pad P4 are constructed by second wires 22a achieved by laminating the two layers of the second barrier layer 247 and the aluminum film or aluminum alloy film 248. The second wires 22a for connecting the circuits are formed on the silicon nitride film 244 as occasion demands.

With respect to user under high voltage or high temperature atmosphere, it is desired that the bonding pad P4 and the pillar-shaped portion T1 in the control circuit portion 242 have a planar structure shown in FIG. 32.

Furthermore, a protection film 249 for coating and protecting the uppermost surface is formed on the silicon substrate 240. The protection film 249 is formed of thick polyimide resin film, and it is opened at only portions needed for the bonding connection of the gold wires 250 in the current collecting electrodes D7, D8 and the bonding pad P4.

FIGS. 33 to 35 are cross-sectional views showing process steps of a method of manufacturing the composite integrated semiconductor device H4 of FIG. 29.

Figure 33A:
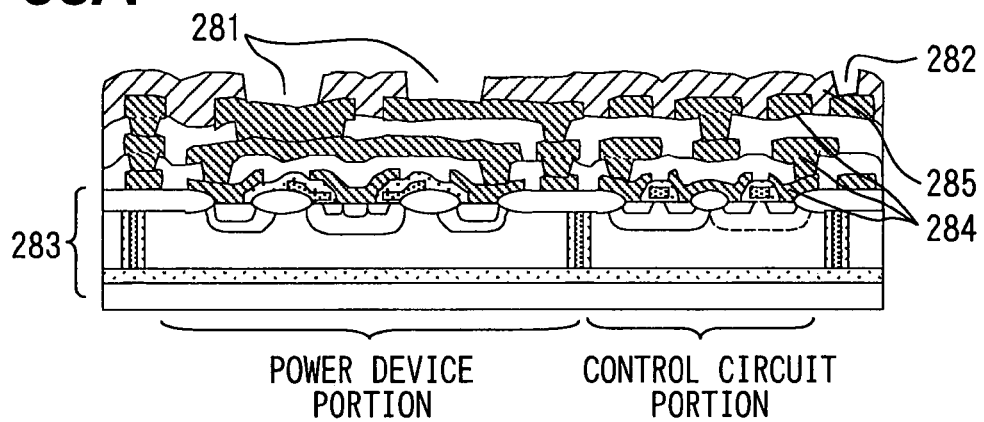
FIGS. 33A-33D are diagrams showing a method of manufacturing the power composite integrated semiconductor device according to the fourth embodiment.

First, as shown in FIG. 33A, a silicon substrate 283 having a power device and a control circuit arranged on the surface thereof is wired by first wires 284 formed of aluminum or aluminum alloy so as to perform desired control. Subsequently, silicon nitride film 285 of 1.0 to 1.8 μm in thickness is formed as insulating film for coating and protecting the first wires 284. The silicon nitride film 285 is opened to form connection holes 281 so that each of the input and the output can collect current on the aluminum wires 284 in the power device portion, and also a wire draw-out connection hole 282 is also formed in the control circuit portion.

Figure 33B:
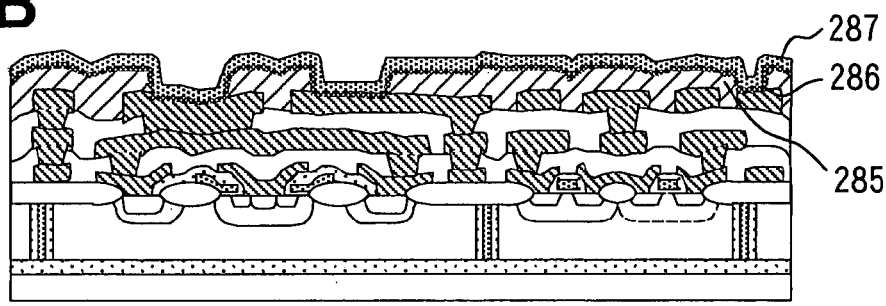

Subsequently, as shown in FIG. 33B, a first baffler layer 286 is formed of titanium, titanium nitride, titanium tungsten or the laminate film thereof at a thickness of 50 to 300 nm on the silicon nitride film 285 so as to cover the opening portions thereof. Subsequently, a copper seed layer 287 of 0.1 to 1.0 μm in thickness is formed under vacuum.

Figure 33C:
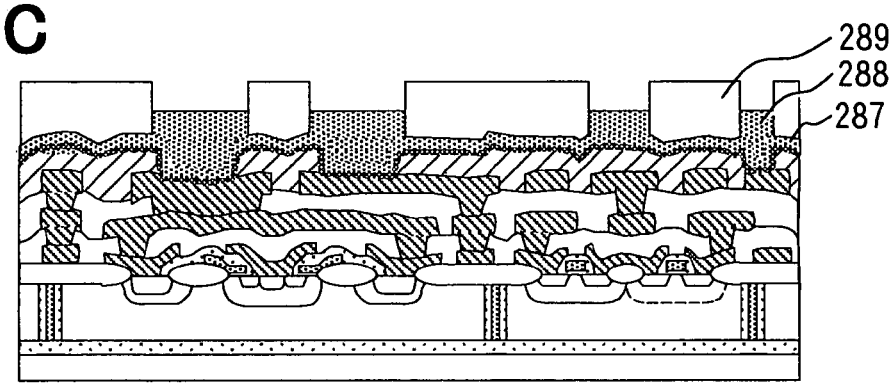

Subsequently, as shown in FIG. 33C, a resist 289 of about 10 μm in thickness is formed so as to be opened at portions where thick-film electrodes will be formed by the photolithography technique. A copper-plated layer 288 of 2 to 7 μm in thickness is formed at the opening portions of the resist 289 with the resist 289 as a mask and the copper seed layer 287 as electrodes by the electroplating technique which is low in manufacturing cost. The copper-plated layer 288 finally becomes a thick-film copper-plated electrode 290.

Figure 33D:
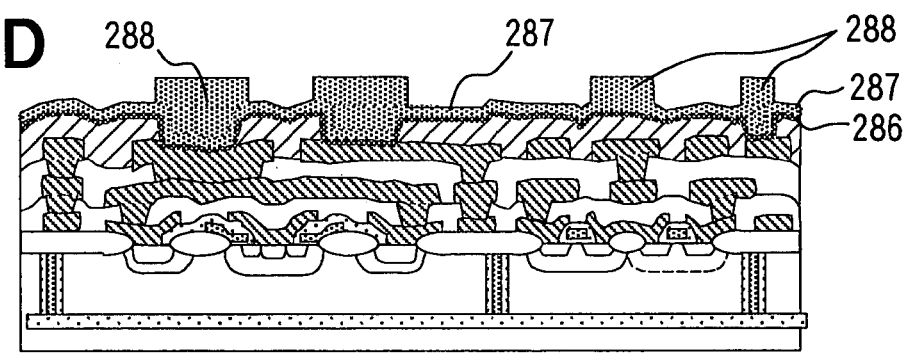

The resist 289 used as the mask in the plating step is removed as shown in FIG. 33D.

Figure 34A:
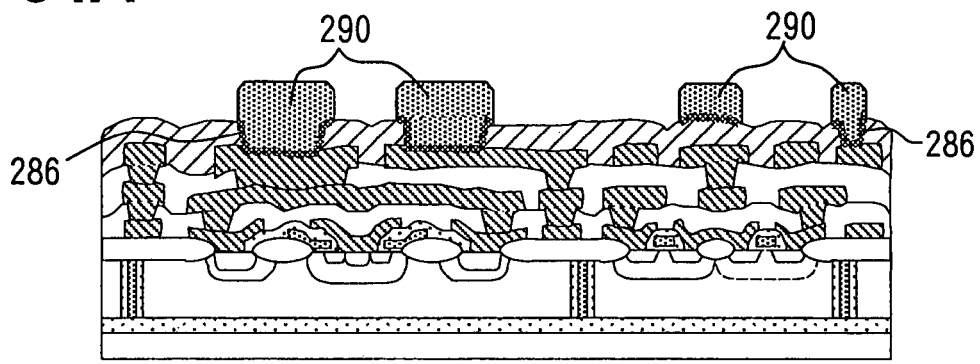
FIGS. 34A-34C are diagrams showing the method of manufacturing the power composite integrated, semiconductor device according to the fourth embodiment.

Subsequently, as shown in FIG. 34A, unnecessary portions of the first barrier layer 286 and copper seed layer 287 are removed by an etching treatment without using any resist mask, thereby forming the copper-plated electrodes 290.

In the etching treatment, the corner portions of the thick-film copper-plated electrodes 290 are rounded or chamfered at the same time. The etching treatment as described above may be a wet-type treatment, for example. Accordingly, the cross-sectional shape of the current collecting electrode of FIG. 32 is formed. The rounding or chamfering of the corner portions in plan view of the current collecting electrode of FIG. 32 is set by the opening pattern of the resist 289 of FIG. 33C.

Figure 34B:
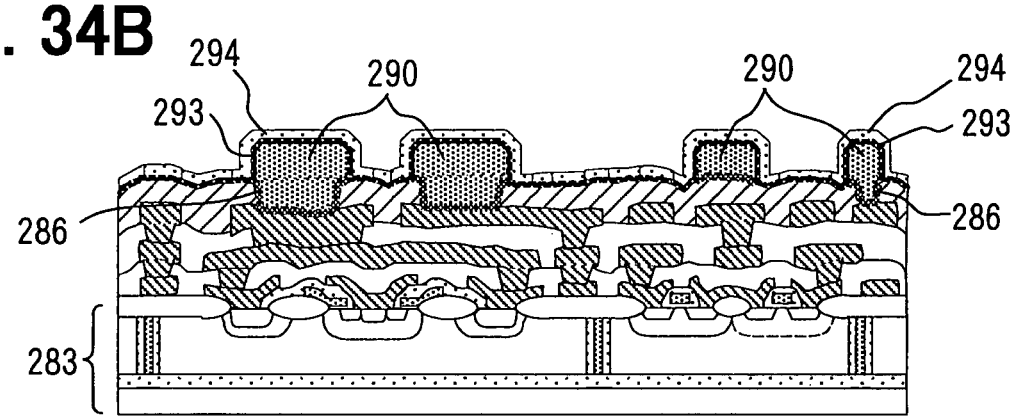

Subsequently, as shown in FIG. 34B, a second barrier layer 293 is formed of titanium, titanium nitride, titanium tungsten or the laminate film thereof at a thickness of 50 to 300 nm on the whole surface of the silicon substrate 283 so as to be perfectly coated on the upper surface and whole side surface of the thick-film copper-plated electrodes 290. Furthermore, an aluminum cap layer 294 is also continuously formed of aluminum or aluminum alloy at a thickness of 0.8 to 1.5 μm on the whole surface of the silicon substrate 283 under vacuum so as to cover the whole copper-plated electrodes 290 as in the case of the second barrier layer 293.

Figure 34C:
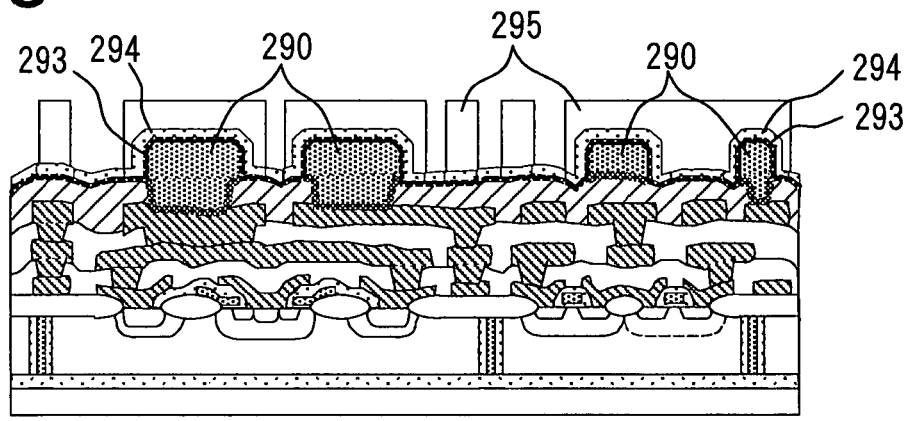

Subsequently, as shown in FIG. 34C, a resist 295 is formed by a patterning treatment so that the thick-film copper-plated electrodes 290 are perfectly covered by the resist 295 and the laminate portion of the two layers of the second barrier layer 293 and the aluminum cap layer 294 is usable as wires.

In order to form the structure of the current collecting electrode shown in FIG. 32, the pattern of the resist 295 is set so that the planar shape of the second barrier layer 293 and the aluminum cap layer 294 coated on the thick-film copper-plated electrode 290 is larger than in planar size than the planar shape of the copper-plated electrode 290 so as to contain the planar shape of the thick-film copper-plated electrode 290 therein.

Unnecessary portions of the aluminum cap layer 294 and the second barrier layer 293 are removed with the resist 295 shown in FIG. 34C as a mask by etching.

Figure 35A:
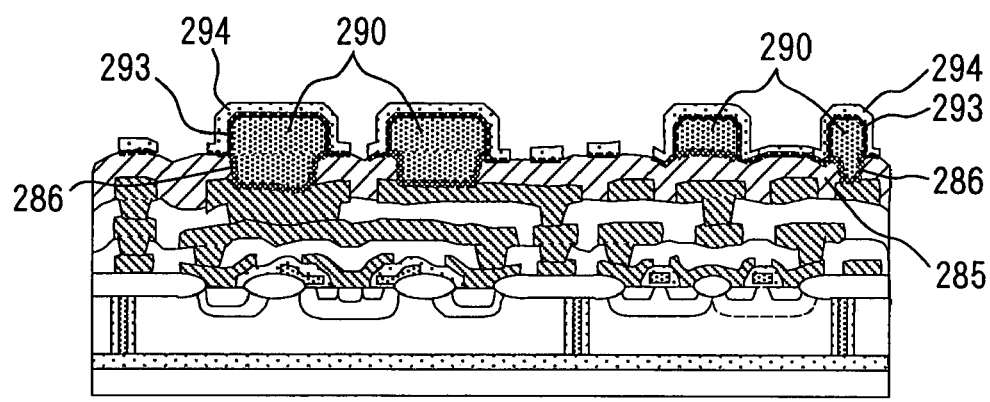
FIGS. 35A-35B are diagrams showing the method of manufacturing the power composite integrated semiconductor device according to the fourth embodiment.

Accordingly, as shown in FIG. 35A, there are formed the thick-film copper-plated-electrodes 290 which are perfectly coated with the aluminum cap layer 294 through the second barrier layer 293 on the upper surfaces thereof and the whole side surfaces thereof which contain the end portion of the first barrier layer 286 exposed on the silicon nitride film 285, and the second wires achieved by laminating the two layers of the second barrier layer 293 and the aluminum cap layer 294.

Figure 35B:
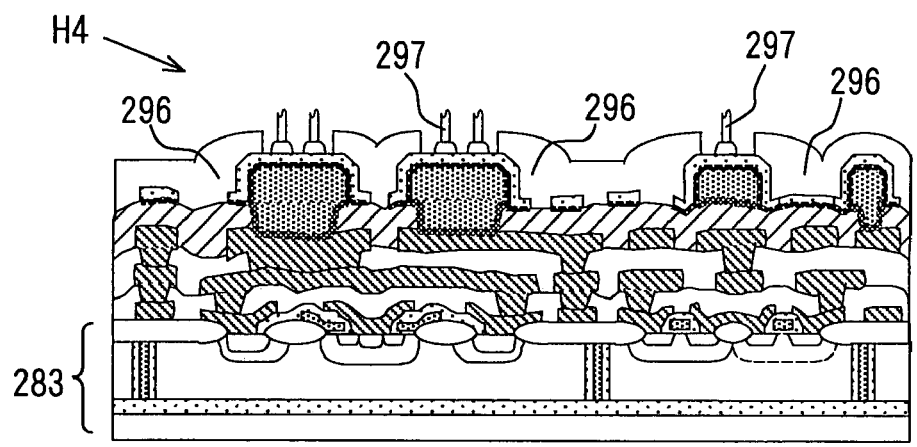

Finally, as shown in FIG. 35B, the uppermost surface of the silicon substrate 283 is coated/protected by polyimide resin film 296. The polyimide resin film 296 is opened at only portions needed for bonding-connection, and gold wires 297 are bonded to the opening portions.

The power composite integrated semiconductor device H4 shown in FIG. 29 is manufactured as described above.

Fifth Embodiment

Figure 36:
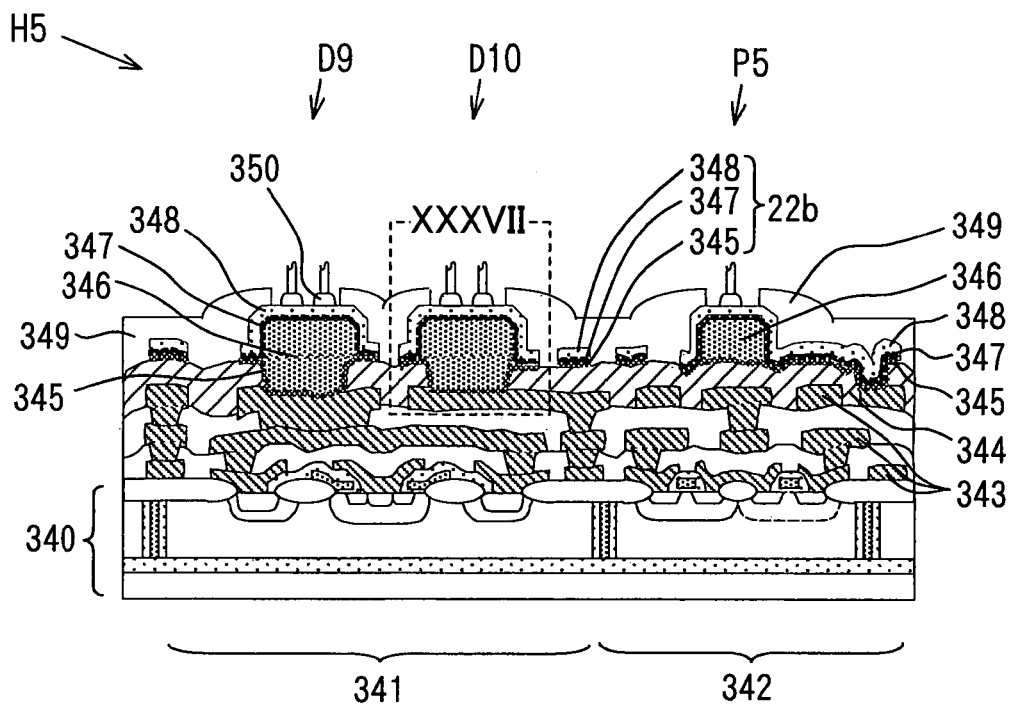
FIG. 36 is a cross-sectional view showing a power composite integrated semiconductor device according to a fifth embodiment.

FIG. 36 is a schematic diagram showing the cross-sectional structure of a power composite integrated semiconductor device H5 according to a fifth embodiment of the present invention.

As in the power composite integrated semiconductor devices H1 to H4 according to the first to fourth embodiments, the power composite integrated semiconductor device H5 shown in FIG. 26 is a power composite integrated semiconductor device in which a power device portion 341 having a power device formed therein and a control circuit portion 342 having a control circuit formed therein are arranged on the surface layer portion of the silicon substrate 340. The power device portion 341 and the control circuit portion 342 are wire-connected by first wires 343 formed of aluminum or aluminum alloy disposed on the silicon substrate 340 so as to perform desired control.

Silicon nitride film 344 is formed as insulating film for coating and protecting the first wires 343. The silicon nitride film 344 is opened at the power device portion 341 so that each of the input and the output can collect current on the first wires 343, and also opened at least a portion for taking out the input/output of the control circuit in the control circuit portion 342.

In the power device portion 341 of the power composite integrated semiconductor device H5 shown in FIG. 36, current collecting electrodes D9, D10 formed of thick-film copper electrodes 346 connected to the first wires 343 there under through a lower barrier layer 345 are arranged at the opening portions for the current collection of the input and the output.

The lower barrier layer 345 is formed of titanium, titanium nitride, titanium tungsten or the laminate film thereof. The thick-film copper electrode 346 is formed at a thickness of 2 to 8 μm by electroplating, and it is designed so that the upper surface and whole side surface thereof are perfectly coated with aluminum film or aluminum alloy film 348 of 0.8 to 1.5 μm in thickness through an upper barrier layer 347 of 50 to 300 nm (aluminum cap layer). The upper barrier layer 347 is also formed of titanium, titanium nitride, titanium tungsten or the laminate film thereof. It is desired that the lower barrier layer 345 and the upper barrier layer 347 are formed of the same material.

Figure 37:
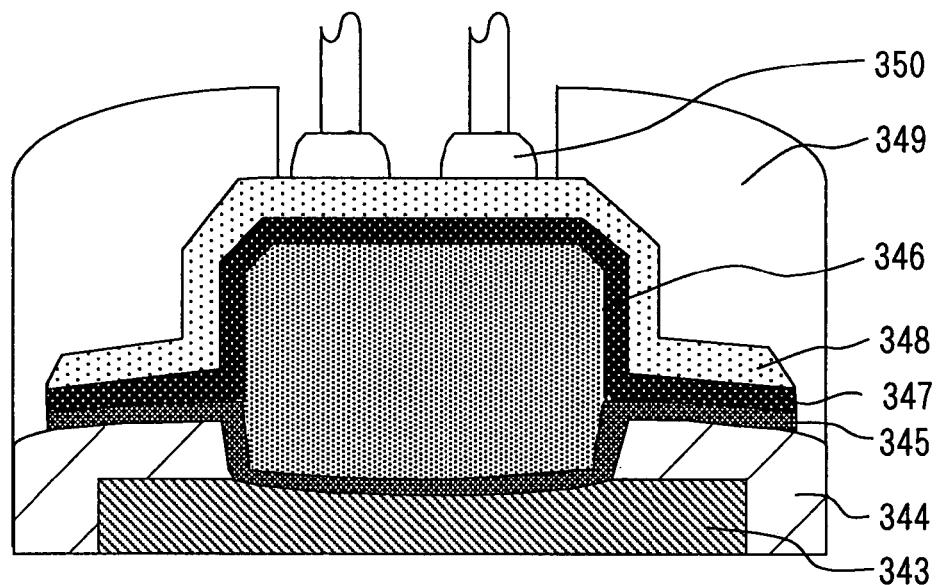
FIG. 37 is an enlarged view of a portion labeled XXXVII of FIG. 36.

FIG. 37 is an enlarged view of a XXXVII portion of FIG. 36.

In the current collecting electrodes D9, D10, in addition to the planar shape of the upper barrier layer.347 and the aluminum film or aluminum alloy film 348 coated on the thick-film copper electrodes 346, the planar shape of the lower barrier layer 345 is processed to be larger in planar size than the planar shape of the thick-film copper electrodes 346.

Accordingly, the thick-film copper electrodes 346 are perfectly wrapped by the lower barrier layer 345, the upper barrier layer 347 and the aluminum film or aluminum alloy film 348.

The current collecting electrodes are opened at only areas needed to perform bonding connection, and the whole thereof is coated with polyimide resin film 249. Accordingly, as in the case of the composite integrated semiconductor device H4 shown in FIGS. 29 and 30, when the device is used under high voltage or high temperature atmosphere, diffusion of copper under high temperature or oxidation of the copper electrodes 346 by a minute amount of water contained in the polyimide resin film 349 can be prevented, and high reliability can be secured.

As in the case of the current collecting electrode shown in FIGS. 32A-32D, in the current collecting electrodes D9, D10 of the power composite integrated semiconductor device H5 shown in FIGS. 36 and 37, the lower barrier layer 345, the copper electrodes 346, the upper barrier layer 347 and the aluminum film or aluminum alloy film 348 are chamfered or rounded at the corner portions thereof in both the planar shape and the cross-sectional shape. Accordingly, even when a high voltage is applied, the concentration of electric field on the corner portions of the current collecting electrodes can be suppressed, and higher reliability can be secured.

In the control circuit portion 342 of the power composite integrated semiconductor device H5 shown in FIG. 36, a bonding pad P5 having the same structure as the current collecting electrodes D9, D10 of the power device portion 341 is disposed on the silicon nitride film 344 in the active region. That is, the bonding pad P5 comprises a copper electrode 346 formed at a thickness of 2 to 8 μm in thickness through the lower barrier layer 345 by plating, and it is designed so that the upper surface and whole side surface of the copper electrode 346 are perfectly coated with the aluminum film or aluminum alloy film 348 (aluminum cap layer) through the upper barrier layer 347.

Furthermore, in order to take out the input/output of the control circuit, wires for connecting the first wires 343 and the bonding pad P5 are constructed by the second wires 22b achieved by laminating the three layers of the lower barrier layer 345, the upper barrier layer 347 and the aluminum film or aluminum alloy film 348 through the openings formed in the silicon nitride film 344. Second wires 22b for connecting the circuits may be formed on the silicon nitride film 344 as occasion demands.

Furthermore, protection film 349 for coating and protecting the uppermost surface is formed on the silicon substrate 340. The protection film 349 is formed of thick polyimide resin film, and it is opened at only portions needed for the bonding connection of the gold wires 350 in the current collecting electrodes D9, D10 and the bonding pad P5.

FIGS. 38A to 40B are cross-sectional views showing process steps of a method of manufacturing the integrated semiconductor device H5 of FIG. 36.

Figure 38A:
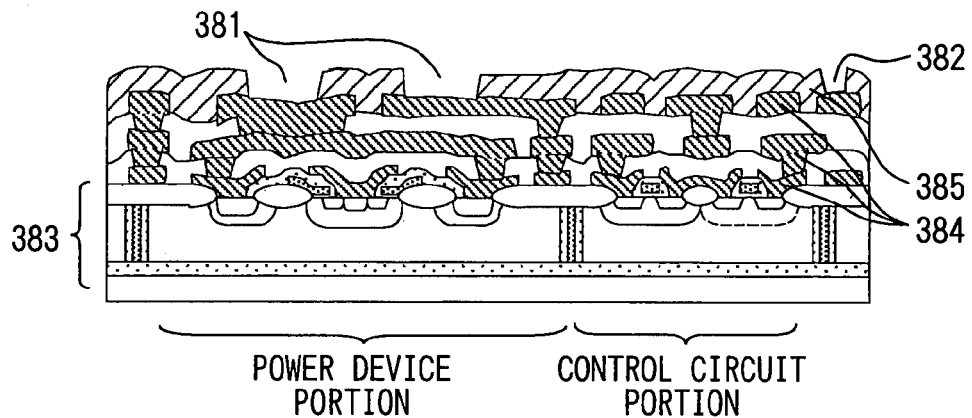
FIGS. 38A-38D are diagrams showing the method of manufacturing the power composite integrated semiconductor device according to the fifth embodiment.

First, as shown in FIG. 38A, the silicon substrate 383 having the power device and the control circuit arranged on the surface thereof is wire-connected by the first wires 384 formed of aluminum or aluminum alloy so as to perform desired control. Subsequently, the silicon nitride film 385 of 1.0 to 1.8 µm in thickness is formed as insulating film for coating and protecting the first wires 384. The silicon nitride film 385 is opened to form connection holes 381 so that the input and the output can collect current on the aluminum wires 384 at the power device portion, and also a connection hole 382 for drawing out a wire is formed in the control circuit portion.

Figure 38B:
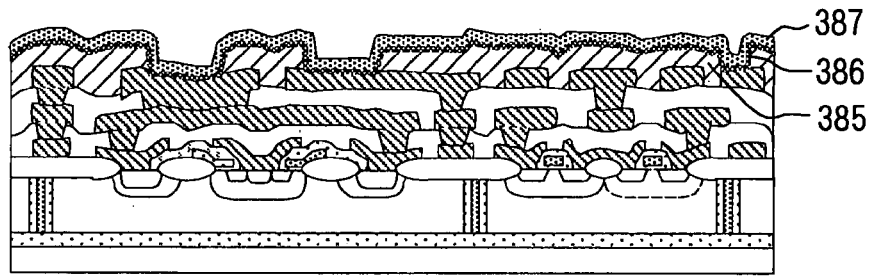

Subsequently, as shown in FIG. 38B, a lower barrier layer 386 is formed of titanium, titanium nitride, titanium tungsten or the laminate film thereof at a thickness of 50 to 300 nm on the silicon nitride film 385 so as to coat the opening portions. Subsequently, a copper seed layer 387 is formed at a thickness of 0.1 to 1.0 µm under vacuum.

Figure 38C:
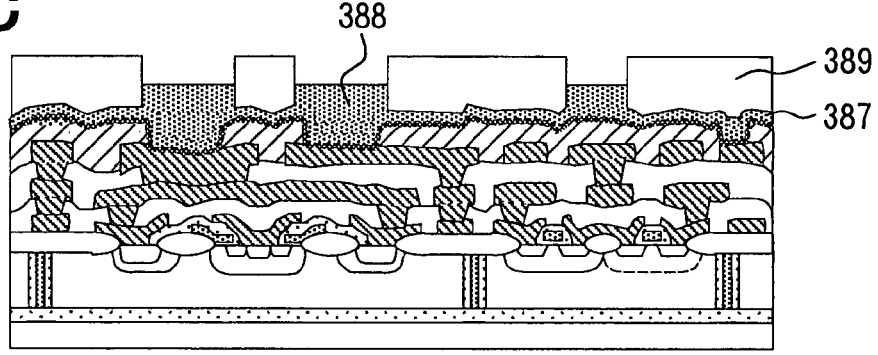

Subsequently, as shown in FIG. 38C, a resist 389 of about 10 µm in thickness is formed so as to be opened at portions where thick-film electrodes are formed by the photolithography technique. A copper-plated layer 388 of 2 to 7 µm is formed at the opening portions of the resist 389 with the resist 389 as a mask and the copper seed layer 387 as the electrodes by using the electroplating technique which is low in manufacturing cost. The copper-plated layer 388 finally becomes thick-film copper-plated electrodes 390.

Figure 38D:
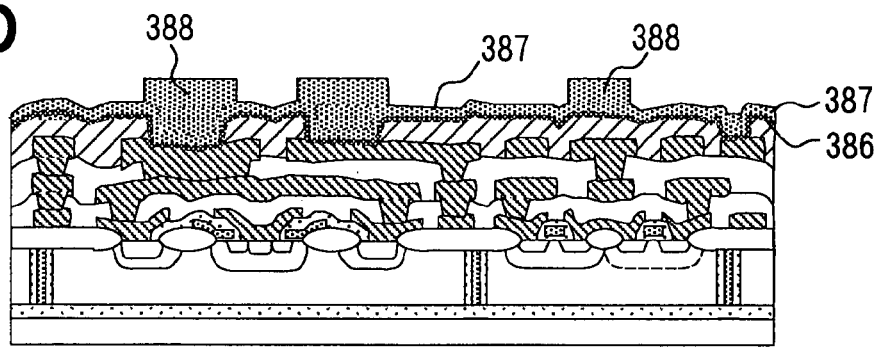

Subsequently, as shown in FIG. 38D, the resist 389 used as the mask in the plating step is removed.

Figure 39A:
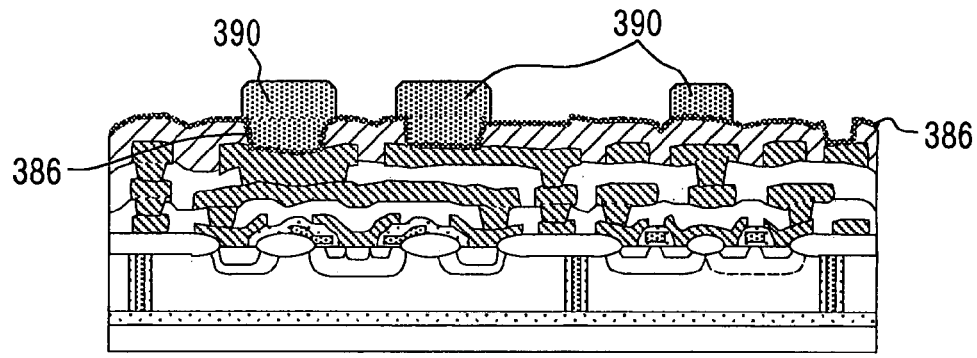
FIGS. 39A-39C are diagrams showing the method of manufacturing the power composite integrated semiconductor device according to the fifth embodiment.

Subsequently, as shown in FIG. 39A, only unnecessary portions of the copper seed layer 287 is removed by the etching treatment without using any resist mask, thereby forming the copper-plated electrodes 290.

In this etching treatment, the corner portions of the thick-film copper-plated electrodes 390 are rounded or chamfered at the same time. The etching treatment as described above may be performed by a wet type treatment. The rounding or chamfering of the corner portions in the planar shape of the thick-film copper-plated electrodes 390 is set by the opening pattern of the resist 389 of FIG. 38C.

Figure 39B:
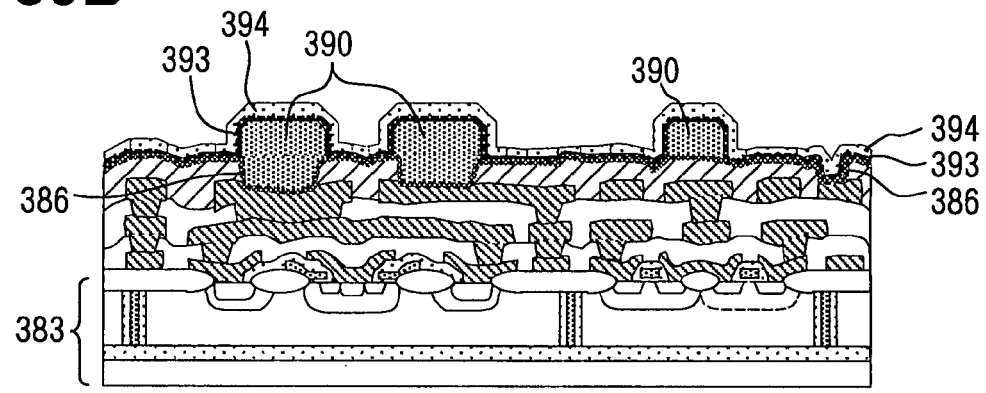

Subsequently, as shown in FIG. 39B, an upper barrier layer 393 of 50 to 300 nm in thickness is formed of titanium, titanium nitride, titanium tungsten or the laminate film thereof is formed on the whole surface of the silicon substrate 383 so as to perfectly coat the upper surfaces and whole side surfaces of the thick-film copper-plated electrodes 390. Furthermore, an aluminum cap layer 394 is continuously formed of aluminum or aluminum alloy at a thickness of 0.8 to 1.5 µm on the whole surface of the silicon substrate 383 under vacuum so as to coat the whole copper-plated electrodes 390 as in the case of the upper barrier layer 393.

Figure 39C:
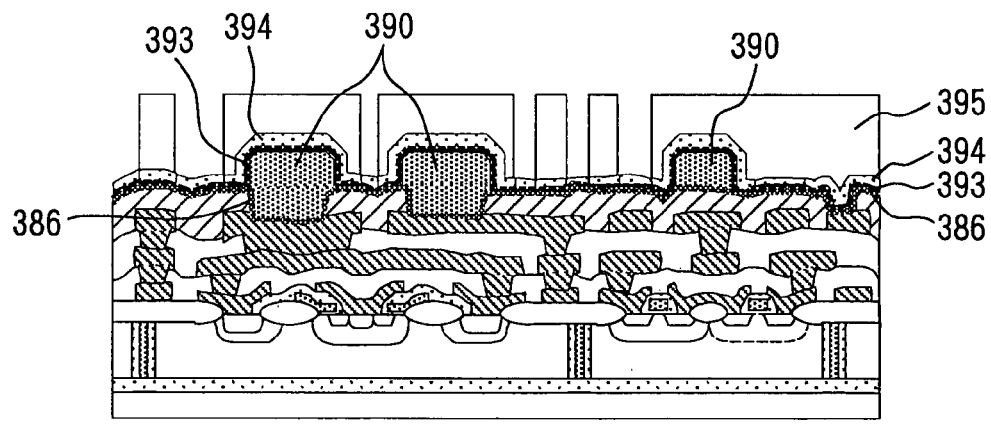

Subsequently, as shown in FIG. 39C, a resist 395 is formed so that it is patterned so as to perfectly coat the thick-film copper-plated electrodes 390 and the laminate portions of the three layers of the lower barrier layer 386, the upper barrier layer 393 and the aluminum cap layer 394 are usable as wires.

The pattern of the resist 395 is set so that the planar shapes of the upper barrier layer 393 and the aluminum cap layer 394 which are coated on the lower barrier layer 386 and the thick-film copper-plated electrodes 390 are larger in plane size than the planar shape of the copper-plated electrodes 390 so as to contain the planar shape of the thick-film copper-plated electrodes 390 therein.

Unnecessary portions of the aluminum cap layer 394, the upper barrier layer 393 and the lower barrier layer 386 are removed through the etching treatment by using the resist 395 shown in FIG. 39C as a mask.

Figure 40A:
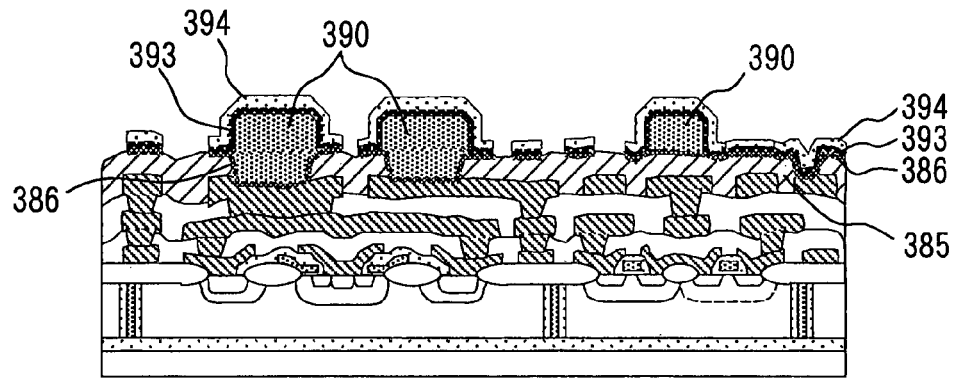
FIGS. 40A-40B are diagrams showing the method of manufacturing the power composite integrated semiconductor device according to the fifth embodiment.

Accordingly, as shown in FIG. 40A, there are formed the thick-film copper-plated electrodes 390 which are perfectly coated with the lower barrier layer 386, the upper barrier layer 393 and the aluminum cap layer 394 on the lower, upper and whole side surfaces thereof, and the second wires achieved by laminating the three layers of the lower barrier layer 386, the upper barrier layer 393 and the aluminum cap layer 394.

Figure 40B:
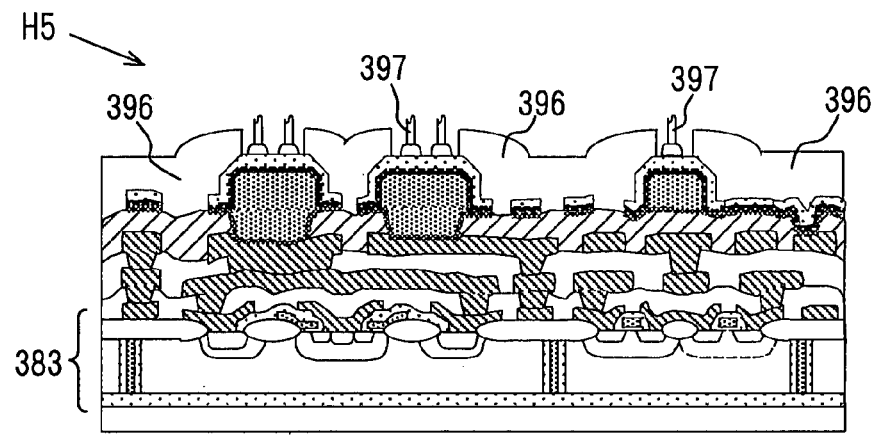

Finally, the uppermost surface of the silicon substrate 383 is coated/protected by the polyimide resin film 396 as shown in FIG. 40B. The polyimide resin film 396 is opened at only portions needed for bonding connection, and gold wires 397 are bonded to the opening portions.

The power composite integrated semiconductor device H5 shown in FIG. 36 is manufactured as described above.

Sixth Embodiment

Figure 41:
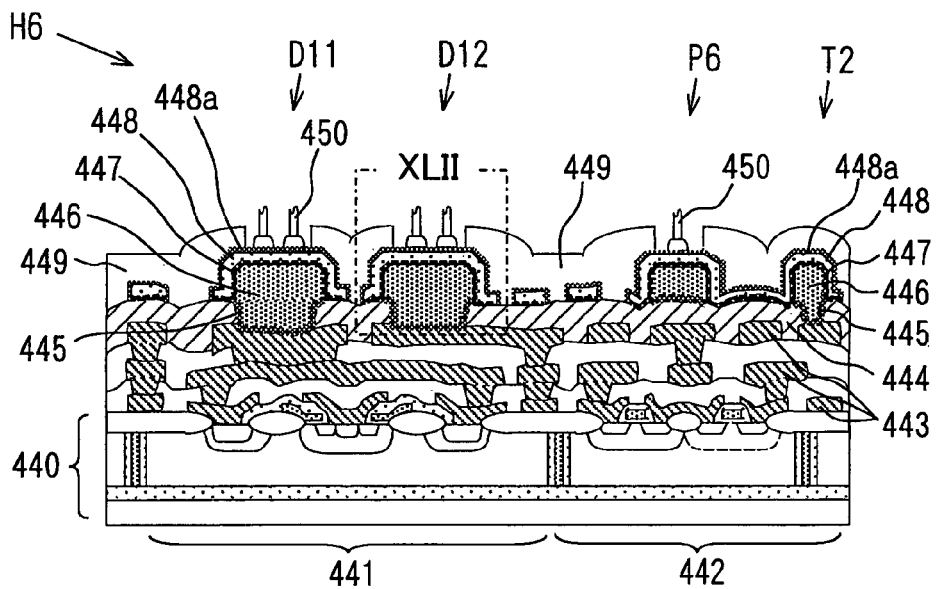
FIG. 41 is a cross-sectional view showing a power composite integrated semiconductor device according to a sixth embodiment.

FIG. 41 is a schematic diagram showing a power composite integrated semiconductor device H6 according to a sixth embodiment of the present invention.

As in the case of the power composite integrated semiconductor devices H1 to H5 according to the first to fifth embodiments, the power composite integrated semiconductor device H6 shown in FIG. 41 is a power composite integrated semiconductor device in which a power device portion 441 having a power device formed therein and a control circuit portion 442 having a control circuit formed therein are arranged on the surface portion of the silicon substrate 440. The power device portion 441 and the control circuit portion 442 are wire-connected by first wires 443 formed of aluminum or aluminum alloy arrange disposed on the silicon substrate 440 so as to perform desired control.

Furthermore, silicon nitride film 444 is formed as insulating film for coating and protecting the first wires 443. The silicon nitride film 444 is opened at the power device portion 441 so that each of the input and output can collect current on the first wires 443, and also opened at at least a portion for taking out the input/output of the control circuit in the control circuit portion 442.

In the power device portion 441 of the power composite type semiconductor device H6 shown in FIG. 41, current collecting electrodes D11, D12 formed of thick-film copper electrodes 446 connected to the lower first wires 443 through the first barrier layer 445 are disposed at the opening portions for the current collection of the input/output.

The first barrier layer 445 is formed of titanium, titanium nitride, titanium tungsten or the laminate film thereof. The thick-film copper electrode 446 is formed at a thickness of 2 to 8 µm by electroplating, and it is designed so that the upper surface thereof and the whole side surface thereof which contains the end portion of the first barrier layer 445 exposed onto the silicon nitride 444 are perfectly coated with aluminum film or aluminum alloy film 448 of 0.8 to 1.5 μm in thickness through a second barrier layer 447 of 50 to 300 nm in thickness (aluminum cap layer). The second barrier layer 447 is also formed of titanium, titanium nitride, titanium tungsten or the laminate film thereof. It is desired that the first barrier layer 445 and the second baffler layer 447 are formed of the same material.

The surface of the aluminum film or aluminum alloy film 448 is reformed and a surface reforming layer 448*a* is formed on the upper surface and end surface thereof. The surface reforming layer 448*a* is specifically formed of aluminum oxide or aluminum nitride.

Figure 42:
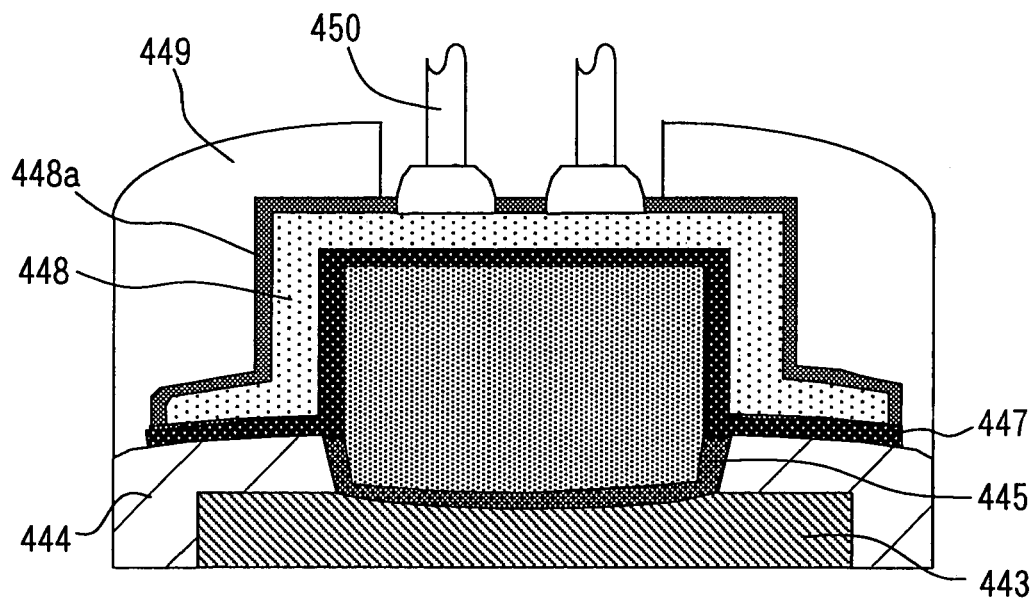
FIG. 42 is an enlarged view showing a portion labeled XLII of FIG. 41.

FIG. 42 is an enlarged view of a XLII portion of FIG. 41.

As in the case of the current collecting electrodes D7, D8 of the power composite integrated semiconductor device H4 shown in FIGS. 29 and 30, in the power composite integrated semiconductor device H6 shown in FIGS. 41 and 42, the planar shapes of the second barrier layer 447 and the aluminum film or aluminum alloy film 448 coated on the thick-film copper electrodes 446 are processed to be larger in plane size than the thick-film copper electrodes 446. Accordingly, the thick-film copper electrodes 446 are perfectly wrapped by the second barrier layer 447 and the aluminum film or aluminum alloy film 448. Furthermore, the aluminum film or aluminum alloy film 448 is coated with the surface reforming layer 448*a*.

Accordingly, even when the device is used under high voltage or high temperature atmosphere, diffusion of copper under high temperature or oxidation of the copper electrodes 446 by a minute amount of water contained in the polyimide resin film 449 can be prevented, and also the resistance to electrical corrosion can be enhanced by coating the surface of the aluminum film or aluminum alloy film 448 with the surface reforming layer 448*a*, so that higher reliability can be secured.

In FIG. 41, the corner portions of the current collecting electrodes are not chamfered. However, as in the case of the current collecting electrode shown in FIG. 32, it is desired that the copper electrodes 446, the first barrier layer 447, the aluminum film or aluminum alloy film 448 and the surface reforming layer 448*a* may be rounded or chamfered at the corner portions thereof in both the planar shape and the cross-sectional shape. Accordingly, even when a high voltage is applied, the concentration of electric field on the corner portions of the current collecting electrodes is suppressed, and thus higher reliability can be secured.

In the control circuit portion 442 of the power composite integrated semiconductor device H6 shown in FIG. 41, a bonding pad P6 having the same structure as the current collecting electrodes D11, D12 of the power device portion 441 is disposed on the silicon nitride film 444 in the active region. That is, the bonding pad P6 comprises a copper electrode 446 formed at a thickness of 2 to 8 μm through a first barrier layer 445 by plating, and it is designed so that the upper surface of the copper electrode 446 and the whole side surface thereof which contains the end portion of the first barrier layer 445 exposed onto the silicon nitride film 445 are perfectly coated through the second barrier layer 447 by the aluminum film or aluminum alloy film 448 (aluminum cap layer). The surface of the aluminum film or aluminum alloy film 448 is reformed to have a surface reforming layer 448*a* formed on the upper surface and end surface thereof.

In order to take out the input/output of the control circuit, a pillar-shaped portion T2 having the same structure as the current collecting electrodes D11, D12 at the power device portion 441 is formed at an opening formed in the silicon nitride film 444, and wires for connecting the first wires 443 to the bonding pad P6 are constructed by the second wires having the aluminum film or aluminum alloy film 448 as the uppermost layer. In the power composite integrated semiconductor device H6 shown in FIG. 41, the wires achieved by laminating the two layers of the second barrier layer 447 and the aluminum film (or aluminum alloy film) 448 are used as the second wires as in the case of the power composite integrated semiconductor device H4 shown in FIG. 29. However, the wires achieved by laminating the three layers of the lower barrier layer, the upper barrier layer and the aluminum film or aluminum alloy film may be used as in the case of the power composite integrated semiconductor device H5 shown in FIG. 36. The surface of the aluminum film or aluminum alloy film 448 of the uppermost layer in the second wires is reformed to form a surface reforming layer 448*a* thereon.

Furthermore, protection film 449 for coating and protecting the uppermost surface is formed on the silicon substrate 440. The protection film 449 is formed of thick polyimide resin, and it is opened at only portions needed for the bonding connection to the gold wires 450 in the formation portion where the current collecting electrodes D11, D12 and the bonding pad P6.

Figure 44:
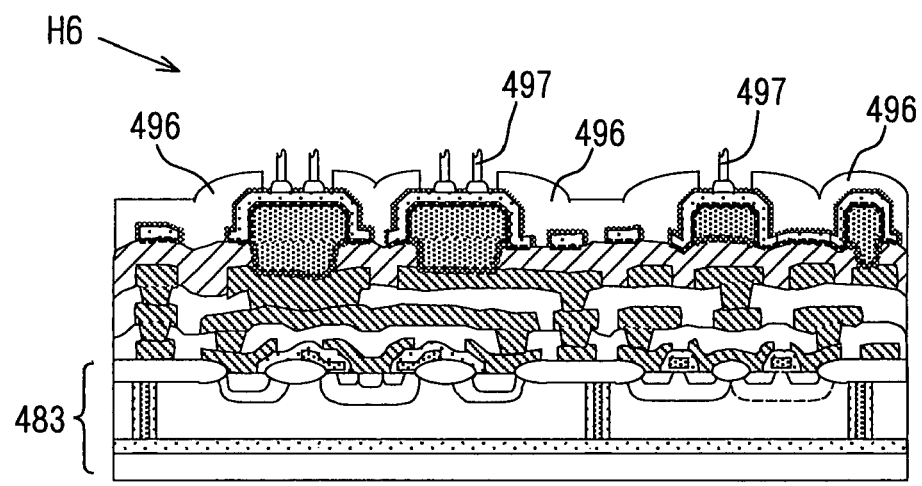
FIG. 44 is a diagram showing the method of manufacturing the power composite integrated semiconductor device according to the sixth embodiment.
Figure 43A:
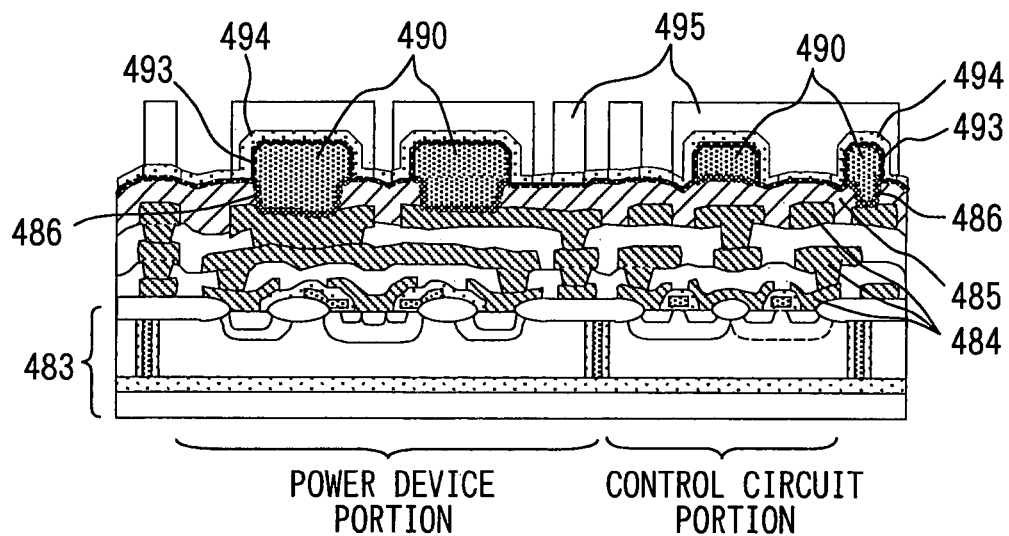
FIGS. 43A-43C are diagrams showing the method of manufacturing the power composite integrated semiconductor device according to a sixth embodiment.

FIGS. 43A-44 are cross-sectional views showing process steps of a method of manufacturing the integrated semiconductor device H6 of FIG. 41.

In the method of manufacturing the integrated semiconductor device H6 of FIG. 41, the steps carried out until FIG. 43A is the same as the steps of FIGS. 33A to 33D and FIGS. 34A, B described in the method of manufacturing the integrated semiconductor device H4 of FIG. 29, and the description thereof is omitted.

Subsequently, as shown in FIG. 43A, a resist 495 is formed while subjected to pattern processing so that the thick-film copper-plated electrodes 490 are perfectly coated with the resist 495 and also the laminate portion of the two layers of the second barrier layer 493 and the aluminum cap layer 494 are usable as wires.

In order to achieve the structure of the current collecting electrodes shown in FIG. 42, the pattern of the resist 495 is set so that the planar shapes of the second barrier layer 493 and the aluminum cap layer 494 which are coated on the thick-film copper-plated electrodes 490 are larger in plane size than the planar shape of the thick-film copper-plated electrodes 490.

Unnecessary portions of the aluminum cap layer 494 and the second barrier layer 493 are removed through the etching treatment by using the resist 495 shown in FIG. 43A as a mask.

Figure 43B:
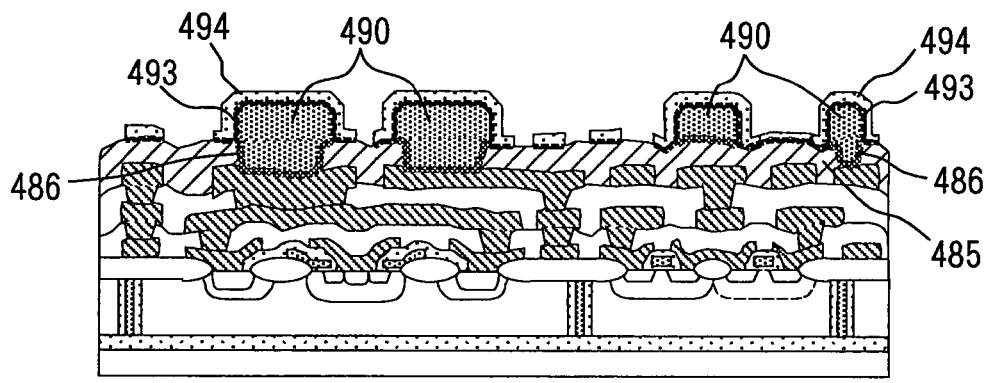

Accordingly, as shown in FIG. 43B, there are formed the thick-film copper-plated electrodes 490 which are perfectly coated with the aluminum cap layer 494 through the second barrier layer 493 on the upper surface thereof and the whole side surface thereof which contains the end portion of the first barrier layer 486 exposed onto the silicon nitride film 485, and the second wires achieved by laminating the two layers of the second barrier layer 493 and the aluminum cap layer 494.

Figure 43C:
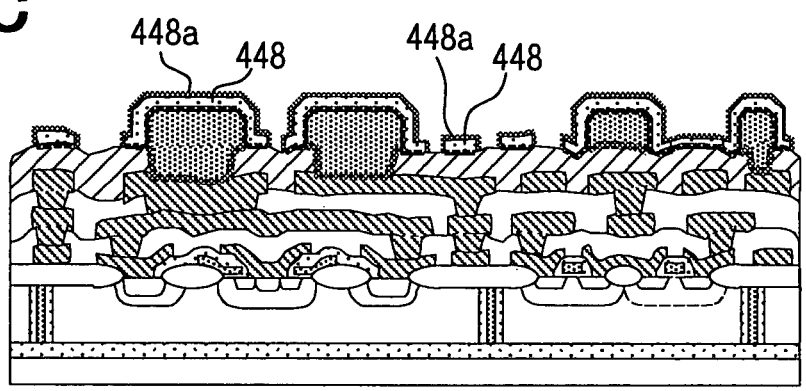

Subsequently, as shown in FIG. 43C, the surface of the aluminum film or aluminum alloy film 448 is reformed to form a surface reforming layer 448*a* formed of aluminum oxide or aluminum nitride on the upper surface and end surface thereof. This surface reforming treatment is carried out by a heat treatment or a plasma treatment under oxygen atmosphere or nitrogen atmosphere.

Finally, as shown in FIG. 44, the uppermost surface of the silicon substrate 483 is coated/protected by the polyimide resin film 496. The polyimide resin film 496 is opened at only portions needed for bonding connection, and gold wires 497 are bonded to the opening portions.

The power composite integrated semiconductor device H6 shown in FIG. 41 is manufactured as described above.

The invention claimed is:

1. A method of manufacturing a semiconductor device that includes a power device portion having a power device formed therein and a control circuit portion having a control circuit formed therein, the power device portion and the control circuit portion being disposed on a surface layer portion of one silicon substrate, characterized in that:

the power device portion and the control circuit portion are wire-connected by first wires formed of aluminum or aluminum alloy disposed on the silicon substrate so as to perform desired control;

silicon nitride film serving as insulating film for coating and protecting the first wires on the silicon substrate is formed so as to be opened at the power device portion so that each of an input and an output can collect current on the first wires and also opened at at least a portion for taking out the input/output of the control circuit at the control circuit portion;

current collecting electrodes that are formed of thick-film copper electrodes connected to the first wires at the lower side through a first barrier layer and each of the current collecting electrodes has a structure that the upper surface and whole side surface thereof are coated with aluminum film or aluminum alloy film through a second barrier layer are arranged at opening portions for current collection in the power device portion;

a bonding pad that is formed of a thick-film copper electrode through the first barrier layer and has a structure that the upper surface and whole side surface thereof are coated with aluminum film or aluminum alloy film through a second barrier layer is disposed on the silicon nitride film in the control circuit portion;

in order to take out the input/output of the control circuit, wires for connecting the first wires to the bonding pad are constructed through the opening formed in the silicon nitride film by second wires that are achieved by laminating the four layers of the first barrier layer, a thin copper wire layer, the second barrier layer and the aluminum film or aluminum alloy film; and thick polyimide resin film serving as a protection film for coating and protecting the uppermost surface of the silicon substrate is formed so as to be opened at only portions needed to perform bonding connection in areas where the current collecting electrodes and the bonding pad are formed.

2. The manufacturing method of the semiconductor device according to claim 1, wherein titanium, titanium nitride, titanium tungsten or laminate film thereof is used for forming the first barrier layer, and the film thickness thereof is set to 50 to 300 nm.

3. The manufacturing method of the semiconductor device according to claim 1, wherein the thick-film copper electrodes in the power device portion and the control circuit portion are formed according to electroplating by using as a seed layer copper thin film continuously formed on the first baffler layer under vacuum and using a mask.

4. The manufacturing method of the semiconductor device according to claim 3, wherein a film thickness of the copper thin film is set to 0.1 to 1.0 μm.

5. The manufacturing method of the semiconductor device according to claim 3, wherein the thin film copper wire layer is formed of the copper thin film.

6. The manufacturing method of the semiconductor device according to claim 1, wherein titanium, titanium nitride, titanium tungsten or the laminate film thereof is used for the second barrier layer, and the film thickness thereof is set to 50 to 300 nm.

7. The manufacturing method of the semiconductor device according to claim 1, wherein the film thickness of the aluminum film or aluminum alloy film is set to 0.8 to 1.5 μm, and the aluminum film or aluminum alloy is continuously formed on the second barrier layer under vacuum.

8. The manufacturing method of the semiconductor device according to claim 1, wherein the film thickness of the polyimide resin film is set to 5 to 15 μm.

\* \* \* \* \*